United States Patent
Kondo et al.

(10) Patent No.: US 11,108,029 B2
(45) Date of Patent: Aug. 31, 2021

(54) ORGANIC EL DISPLAY PANEL MANUFACTURING METHOD AND FUNCTIONAL LAYER FORMING DEVICE

(71) Applicant: JOLED INC., Tokyo (JP)

(72) Inventors: Yoshiaki Kondo, Tokyo (JP); Toshiki Nishikiori, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/679,288

(22) Filed: Nov. 11, 2019

(65) Prior Publication Data
US 2020/0161594 A1 May 21, 2020

(30) Foreign Application Priority Data

Nov. 15, 2018 (JP) .............................. JP2018-214845
Jul. 5, 2019 (JP) .............................. JP2019-126295

(51) Int. Cl.
| | |
|---|---|
| *H01L 51/56* | (2006.01) |
| *H01L 51/50* | (2006.01) |
| *H01L 51/00* | (2006.01) |
| *H01L 27/32* | (2006.01) |

(52) U.S. Cl.
CPC .......... *H01L 51/56* (2013.01); *H01L 27/3246* (2013.01); *H01L 51/0005* (2013.01); *H01L 51/504* (2013.01)

(58) Field of Classification Search
CPC .................... H01L 51/56; H01L 51/504; H01L 51/0003–0005; H01L 27/3246; H01L 27/3211
See application file for complete search history.

(56) References Cited

U.S. PATENT DOCUMENTS

| | | | |
|---|---|---|---|
| 2005/0093902 A1* | 5/2005 | Kato ....................... | H01J 9/205 347/9 |
| 2006/0279200 A1* | 12/2006 | Nagae .................. | B41J 2/14233 313/503 |
| 2007/0200488 A1 | 8/2007 | Ito | |

(Continued)

FOREIGN PATENT DOCUMENTS

| | | |
|---|---|---|
| JP | 2006-159791 A | 6/2006 |
| JP | 2007-234232 A | 9/2007 |
| JP | 2010-82933 A | 4/2010 |

*Primary Examiner* — Errol V Fernandes
*Assistant Examiner* — Jeremy J Joy
(74) *Attorney, Agent, or Firm* — Hauptman Ham, LLP

(57) ABSTRACT

A method of manufacturing an organic electroluminescence display panel including: preparing a substrate; forming pixel electrodes arranged in a matrix above the substrate; forming parallel column banks above the substrate in spaces between the pixel electrodes in a row direction; forming functional layers including organic light emitting layers in gaps between the column banks, including causing relative motion in the row direction between the substrate and a head provided with nozzles arranged along a column direction while ejecting ink from selected nozzles among the nozzles to supply a set of the gaps with an ink including an organic material; and forming a counter electrode above the functional layers. Among the set of the gaps, nozzle patterns of the selected nozzles for a gap differ between a first gap and a second gap in a sequence in the row direction of the set.

20 Claims, 20 Drawing Sheets

(56) References Cited

U.S. PATENT DOCUMENTS

| | | | |
|---|---|---|---|
| 2008/0024539 A1* | 1/2008 | Kotani | G02B 5/201 347/15 |
| 2009/0039772 A1* | 2/2009 | Takashima | H01J 37/32825 313/504 |
| 2010/0079527 A1 | 4/2010 | Sanada | |
| 2012/0045568 A1* | 2/2012 | Truong | H01L 51/0005 427/64 |
| 2015/0001514 A1* | 1/2015 | Goto | H01L 51/0005 257/40 |
| 2017/0301740 A1* | 10/2017 | Goto | H01L 51/56 |

* cited by examiner

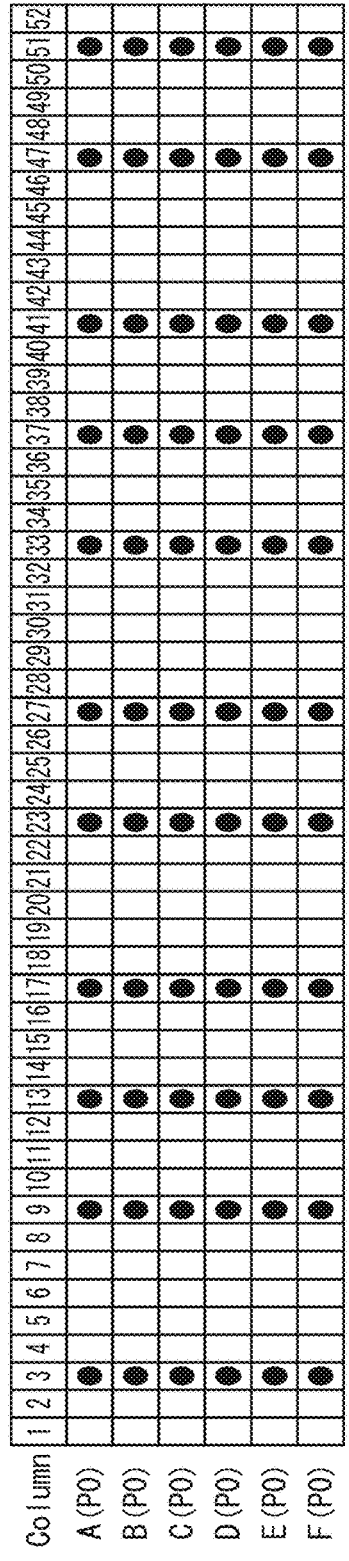
FIG. 8A Patterns of nozzles ejecting ink in example
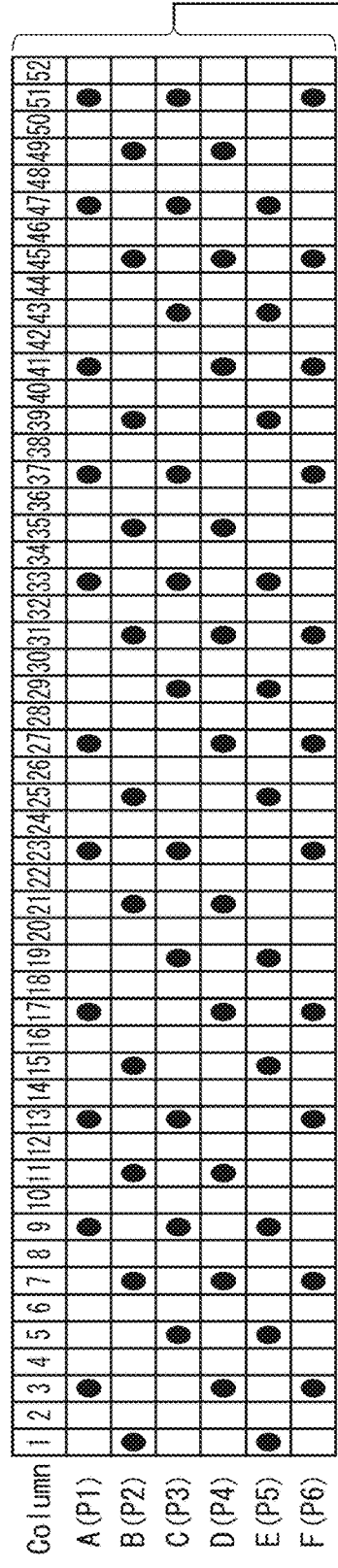
FIG. 8B Patterns of nozzles ejecting ink in embodiment

ORGANIC EL DISPLAY PANEL MANUFACTURING METHOD AND FUNCTIONAL LAYER FORMING DEVICE

This application claims priority to Japanese Patent Application No. 2018-214845 filed Nov. 15, 2018 and Japanese Patent Application No. 2019-126295 filed Jul. 5, 2019, the contents of which are hereby incorporated by reference in their entirety.

BACKGROUND

Technical Field

The present disclosure relates to methods for manufacturing display panels, in particular to organic electroluminescence (EL) display panels that use electroluminescence of organic materials, and devices for forming functional layers of display panels.

Description of Related Art

In recent years, organic EL display panels in which organic EL elements are arranged in a matrix on a substrate have been implemented as display panels used in display devices such as digital televisions. In such organic EL display panels, each organic EL element emits its own light and therefore visibility is high.

Typically, in such organic EL display panels, light emitting layers of adjacent organic EL elements are partitioned by banks made of an insulating material. In an organic EL display panel for a color display, each organic EL element forms a red (R), blue (B), or green (G) pixel and adjacent RGB pixels combine to form unit pixels in a color display. Each organic EL element has a structure in which a functional film such as a light emitting layer including an organic light emitting material is disposed between an electrode pair of an anode and a cathode. When driven, a voltage is applied across the electrode pair, and holes injected to the light emitting layer from the anode and electrons injected to the light emitting layer from the cathode recombine to emit light.

In recent years, as a method for forming efficient functional films as devices are scaled up, wet processes have been proposed in which ink containing a functional material is applied by using an inkjet method or the like.

For example, Japanese Patent Application Publication No. 2007-234232 (hereinafter referred to as JP 2007-234232) describes that film forming is possible by dropping an organic material solution of uniform concentration between banks extending in a column direction and applying a solution amount according to a volume of space between the banks, thereby making it possible to form a uniform organic light emitting layer by a simple and easy process.

However, according to the technology of JP 2007-234232, slight film thickness unevenness of the light emitting layers may remain in the column direction and therefore streaks of luminance unevenness may be visible in the displayed image.

SUMMARY

An organic EL display panel manufacturing method according to at least one embodiment of the present disclosure is a method of manufacturing an organic EL display panel in which a plurality of pixels are arranged in a matrix of rows and columns. The method includes: preparing a substrate; forming pixel electrodes arranged in the matrix above the substrate; forming column banks above the substrate at least in spaces between the pixel electrodes in a row direction to be parallel with each other and to extend in a column direction; forming functional layers including organic light emitting layers in gaps between the column banks that are adjacent in the row direction, the forming of the functional layers including application processing of causing relative motion in the row direction between the substrate and a head provided with a plurality of nozzles arranged along the column direction while performing ink ejection from selected nozzles among the plurality of nozzles to supply the gaps with one or more inks each including an organic material; and forming a counter electrode above the functional layers. In the forming of the functional layers, among a set of the gaps to which one of the one or more inks is to be supplied, nozzle patterns each representing a combination of the selected nozzles for a gap differ between a first gap and a second gap in a sequence in the row direction of the set.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure. In the drawings:

FIG. 8A illustrates examples of patterns of nozzles from which ink is ejected, and FIG. 8B illustrates patterns of nozzles from which ink is ejected in at least one embodiment;

DETAILED DESCRIPTION

<<Circumstances Leading to Disclosure>>

As a method for forming efficient functional films, wet processes have been proposed in which ink containing a functional material is applied by using an inkjet method or the like. In such wet processes, positional accuracy when separating functional films does not depend on substrate size, and therefore a merit of wet processes is that the technical barrier to scaling up devices is relatively low.

Figure 19A:
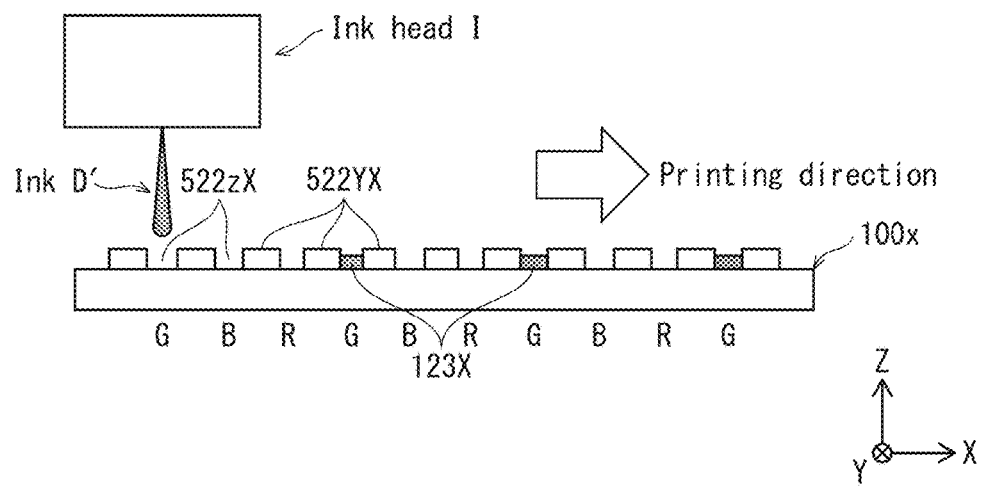
FIG. 19A is a side view diagram illustrating a process according to at least one embodiment of applying ink for light emitting layer formation to gaps 522$z$X between adjacent column banks 522YX on a substrate.
Figure 19B:
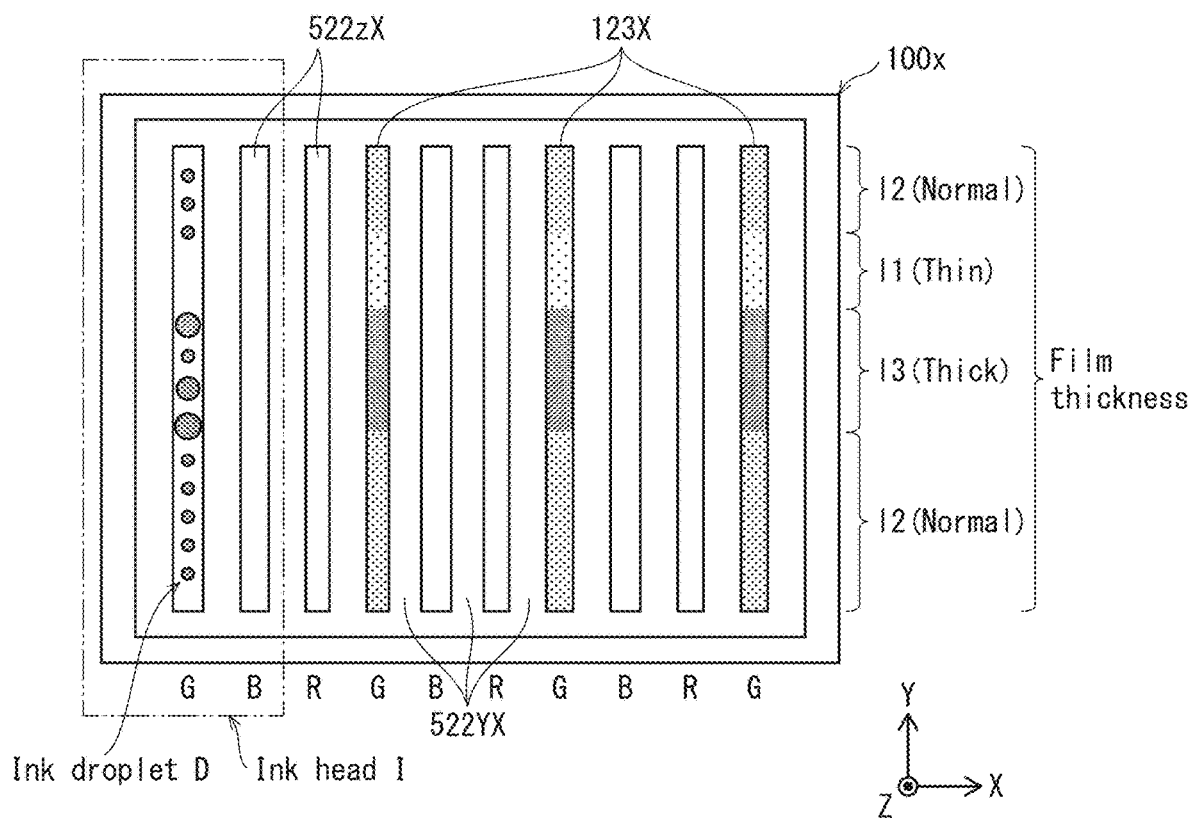
FIG. 19B is a schematic plan view diagram of same.

FIG. 19A is a side view diagram illustrating a process according to at least one embodiment of applying ink for light emitting layer formation to gaps 522$z$X between adjacent column banks 522Y on a substrate and FIG. 19B is a schematic plan view diagram of same.

In the process, as illustrated in FIG. 19A, relative motion in one direction between an ink head I and the surface of the substrate 100$x$ is caused, while ink D' is dropped from nozzles of the ink head I onto defined regions of the surface of the substrate. Solvent of the ink is then evaporated by drying to form a light emitting layer 123X.

At such time, as illustrated in FIG. 19B, in the process of dropping and applying ink onto the substrate, thicknesses 11, 12, and 13 of the light emitting layer 123X tend to vary in a direction parallel to the nozzle column (Y direction) due to factors such as variation in dropping amounts of the ink D' ejected from the nozzles.

This is construed as being due to variation in sizes of ink droplets ejected from the nozzles of the ink head, unevenness of gaps between the nozzles, uneven wet-spreading on a surface on which the ink is applied, or the like.

To counter this tendency, JP 2007-234232 describes that film is formed by dropping an organic material solution of uniform concentration between banks in the Y direction, applying a solution amount according to a volume of space between the banks, thereby making it possible to form a uniform organic light emitting layer by a simple and easy process.

That is, by providing a column-shape application region in a gap between line-shape banks that allows applied ink to flow between pixels in a direction parallel to the nozzle column, applied ink is levelled in the direction parallel to the nozzle column (Y direction) to reduce variation in film thickness of functional layers, and occurrence of streaks of luminance unevenness in an organic EL display panel can be reduced.

However, according to studies by the inventors, even when an inkjet device is provided with column-shape application regions parallel to a nozzle column in order to level applied ink, it is difficult to completely overcome small variations in functional layer film thickness, and it has been found that streaks of luminance unevenness extending in an X direction are recognized on a display screen.

Figure 20A:
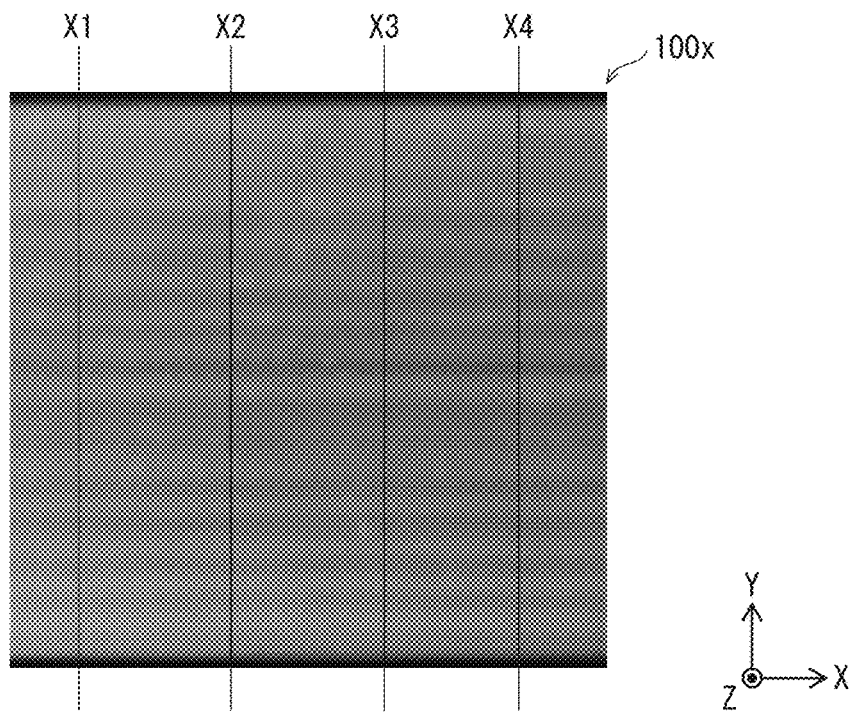
FIG. 20A is a photograph illustrating a display image of an example of an organic EL display.

FIG. 20A is a photograph illustrating a display image of an example of an organic EL display panel, showing a region corresponding to 150 sub-pixels in the X direction and the Y direction on the substrate 100$x$. As described above, when film thicknesses of the light emitting layers 123X are different, light emitting properties of each of the light emitting layers 123X differ, and this is a cause of streaks of luminance unevenness parallel to a nozzle scanning direction in an organic EL display panel.

Specifically, in a top-emission type of organic EL element, film thickness is set in order that an optical resonator structure improves light emission efficiency by making a surface portion of a pixel electrode using a material having high light reflectivity and by optimally setting an optical distance in a film thickness direction, and due to this, film thickness unevenness greatly affects luminance unevenness as described above.

Figure 20B:
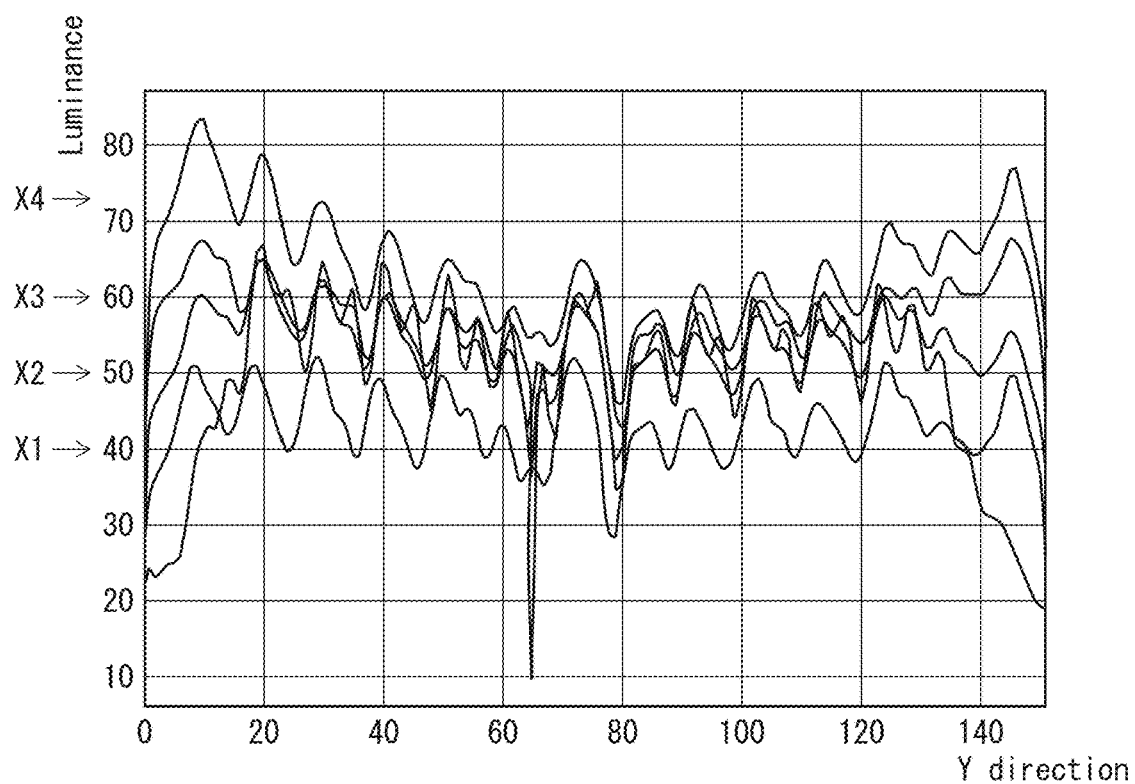
FIG. 20B is a graph of measurement results illustrating luminance distribution taken at positions X1, X2, X3, and X4 from FIG. 20A.

FIG. 20B is a graph of measurement results illustrating luminance distribution for a region corresponding to 150 sub-pixels in Y direction cross-sections taken at positions X1, X2, X3, and X4 in FIG. 20A. According to FIG. 20B, it can be seen that the luminance distributions at different positions X1, X2, X3, and X4 in the scanning direction of ink head I (X direction) have similar distribution shapes in a column direction (Y direction) that are recognized as streaks of luminance unevenness in a row direction.

In view of the technical problem described above, for a panel structure in which functional layers including light emitting layers extending in a column direction are arranged in parallel, the inventors investigated a configuration that makes streaks of luminance unevenness in a row direction caused by changes in film thicknesses of functional layers in a column direction less conspicuous, and arrived at the embodiment described below.

<<Overview of Embodiment of Present Disclosure>>

An organic EL display panel manufacturing method pertaining to at least one embodiment of the present disclosure is a method of manufacturing an organic EL display panel in which a plurality of pixels are arranged in a matrix of rows and columns. The method includes: preparing a substrate; forming pixel electrodes arranged in the matrix above the substrate; forming column banks above the substrate at least in spaces between the pixel electrodes in a row direction to be parallel with each other and to extend in a column direction; forming functional layers including organic light emitting layers in gaps between the column banks that are adjacent in the row direction, the forming of the functional layers including application processing of causing relative motion in the row direction between the substrate and a head provided with a plurality of nozzles arranged along the column direction while performing ink ejection from selected nozzles among the plurality of nozzles to supply the gaps with one or more inks each including an organic material; and forming a counter electrode above the functional layers. In the forming of the functional layers, among a set of the gaps to which one of the one or more inks is to be supplied, nozzle patterns each representing a combination of the selected nozzles for a gap differ between a first gap and a second gap in a sequence in the row direction of the set.

According to this, in a panel structure in which functional layers extending in a column direction are arranged in parallel, among a set of the gaps to which one of the one or more inks is to be supplied, nozzle patterns each representing a combination of the selected nozzles for a gap differ between a first gap and a second gap in a sequence in the row direction of the set, and therefore variation in film thicknesses of functional layers including the light emitting layers is discontinuous in the row direction. This helps manufacture an organic EL display panel in which occurrence of streaks of luminance unevenness is suppressed.

According to an organic EL display panel manufacturing method pertaining to at least one embodiment of the present disclosure, in the forming of the functional layers, the organic material is an organic light emitting material and the functional layers include only the organic light emitting layers.

This helps prevent variation in film thicknesses of the organic light emitting layers in the column direction, which greatly affects luminance, from being continuous in the row direction. Due to this, the variation in film thicknesses of the organic light emitting layers is less conspicuous as streaks of luminance unevenness.

According to an organic EL display panel manufacturing method pertaining to at least one embodiment of the present disclosure, for each of N gaps in a sequence in the row direction of the set, a different one of the nozzle patterns is used, N being an integer equal to or greater than two, and the application processing is performed with respect to the gaps of the set by repeatedly using the nozzle patterns for the N gaps in the row direction.

According to this, determining in advance nozzle patterns for N gaps helps prevent streaks of luminance unevenness from occurring in the entirety of the display screen.

According to an organic EL display panel manufacturing method pertaining to at least one embodiment of the present disclosure, N is an integer equal to or greater than six.

If six different nozzle patterns are provided, streaks of luminance unevenness are inconspicuous even when the six nozzle patterns are repeatedly used in the row direction. This helps prevent a display screen of low image quality from being manufactured.

According to an organic EL display panel manufacturing method pertaining to at least one embodiment of the present disclosure, the nozzle patterns for the set of the gaps are set such that all of the selected nozzles used for ink ejection into the first gap are not used at least for ink ejection into the second gap.

According to this, in a set of the gaps to which one of the one or more inks is to be supplied, the same nozzles are not used consecutively in the row direction. This helps streaks of luminance unevenness to be inconspicuous to a similar extent in the entirety of the organic EL display panel.

According to an organic EL display panel manufacturing method pertaining to at least one embodiment of the present disclosure, in the forming of the functional layers, the application processing is performed with the head fixed in the row direction and with the substrate being moved in the row direction relative to the head.

This helps stabilize accuracy of the ink application processing onto the substrate.

According to an organic EL display panel manufacturing method pertaining to at least one embodiment of the present disclosure, the forming of the functional layers includes: forming of first organic light emitting layers; and forming of second organic light emitting layers emitting a different color from color emitted from the first organic light emitting layers, and nozzle patterns used in the forming of the first organic light emitting layers are different from nozzle patterns used in the forming of the second organic light emitting layers.

According to this, different nozzle patterns are used even for light emitting layers emitting different colors. This further helps overcome streaks of luminance unevenness.

According to an organic EL display panel manufacturing method pertaining to at least one embodiment of the present disclosure, the nozzle patterns used in the forming of the first organic light emitting layers differ from the nozzle patterns used in the forming of the second organic light emitting layers in a number of the nozzles used for supplying ink into one gap.

According to this, light emitting layers have different film thicknesses in accordance with the color that the light emitting layers emit. This helps reduce occurrence of streaks of luminance unevenness while implementing an optical resonator structure.

A display panel manufacturing method pertaining to at least one embodiment of the present disclosure is a method of manufacturing a display panel in which a plurality of pixels are arranged in a matrix of rows and columns. The method includes: preparing a substrate; forming pixel electrodes arranged in the matrix above the substrate; forming column banks above the substrate at least in spaces between the pixel electrodes in a row direction to be parallel with each other and to extend in a column direction; forming functional layers including organic light emitting layers in gaps between the column banks that are adjacent in the row direction, the forming of the functional layers including application processing of causing relative motion in the row direction between the substrate and a head provided with a plurality of nozzles arranged along the column direction while performing ink ejection from selected nozzles among the plurality of nozzles to supply the gaps with one or more inks each including a functional material; and forming a counter electrode above the functional layers. In the forming of the functional layers, among a set of the gaps to which one of the one or more inks is to be supplied, nozzle patterns each representing a combination of the selected nozzles for a gap differ between a first gap and a second gap in a sequence in the row direction of the set.

According to this, aside from organic EL display panels, display panels in which occurrence of streaks of luminance unevenness is suppressed are manufactured.

Here, the term "functional material" refers to a material having a specific light emitting characteristics and a material having a specific function for forming a desired display panel, such as a hole injection function, a hole transport function, an electron injection function, an electron transport function, and the like.

Further, a functional layer forming device pertaining to at least one embodiment of the present disclosure is a device for manufacturing functional layers in an organic EL display panel in which a plurality of pixels are arranged in a matrix of rows and columns. The device includes: an application device applying one or more inks each including a functional material to gaps between column banks that are parallel with each other, extend in a column direction, and are disposed above the substrate at least in spaces between the pixel electrodes in a row direction. The application device includes: a head that includes a plurality of nozzles arranged along the column direction; a moving unit that causes relative motion in the row direction between the head and the substrate; and a supply controller that causes the one or more inks to be supplied from selected nozzles among the plurality of nozzles such that, in the forming of the functional layers, among a set of the gaps to which one of the one or more inks is to be supplied, nozzle patterns each representing a combination of the selected nozzles for a gap differ between a first gap and a second gap in a sequence in the row direction of the set.

This functional layer forming device helps manufacture a display panel in which, even upon occurrence of film thickness variation in the column direction of the functional layers formed through application to a set of the gaps to which one of the one or more inks is supplied, such film thickness variation is inconspicuous as streaks of luminance unevenness.

Embodiment

1. Configuration of Display Device (1) Circuit Configuration of Display Device 1

The following is a description of a circuit configuration of an organic electroluminescence (EL) display device 1 according to an embodiment (hereinafter also referred to as "display device 1") provided with reference to FIG. 1.

Figure 1:
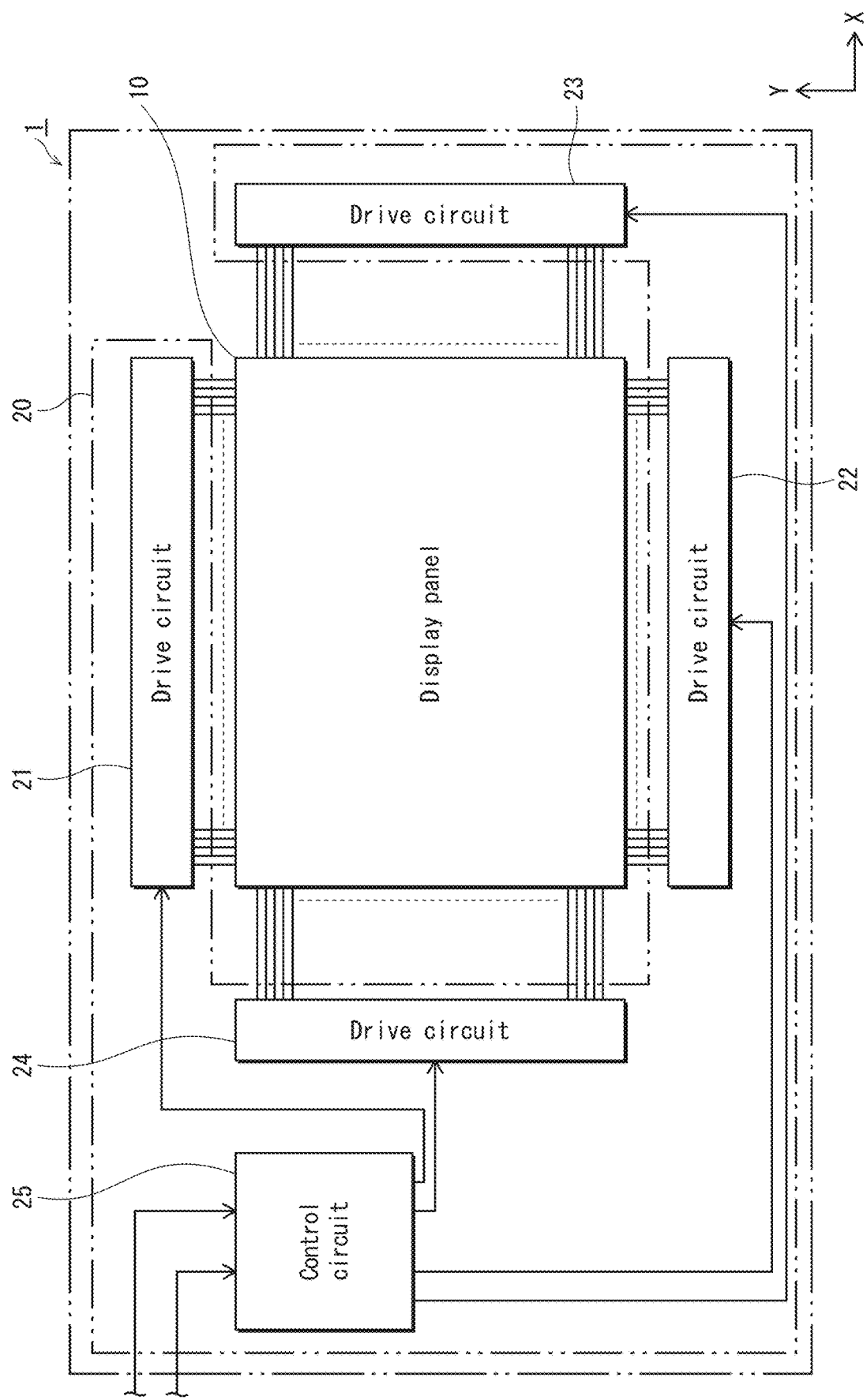
FIG. 1 is a schematic block diagram illustrating circuit configuration of an organic EL display device according to at least one embodiment.

As illustrated in FIG. 1, the display device 1 includes an organic EL display panel 10 (hereinafter also referred to as "display panel 10") and drive control circuitry 20 connected to the display panel 10.

The display panel 10 is an organic EL panel that makes use of electroluminescence of an organic material, in which organic EL elements are, for example, arranged in a matrix.

The drive control circuitry 20 includes four drive circuits 21, 22, 23, 24 and a control circuit 25.

(2) Circuit Configuration of Display Panel 10

In the display panel 10, unit pixels 100e are arranged in a matrix (see FIG. 4), forming a display region. Each of the unit pixels 100e includes three organic EL elements, i.e., three sub-pixels 100se emitting red (R), green (G), and blue (B) light respectively. Circuit configuration of each of the sub-pixels 100se is described with reference to FIG. 2.

Figure 2:
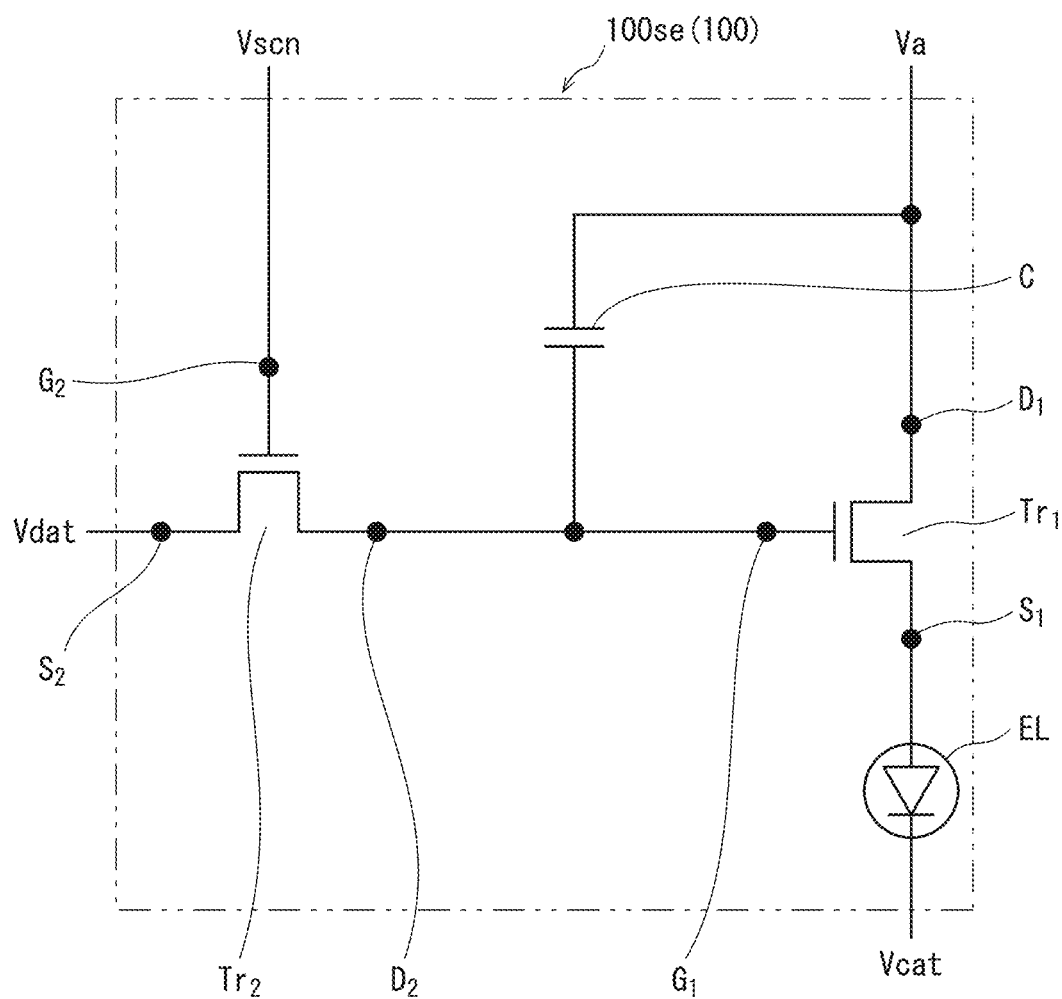
FIG. 2 is a schematic circuit diagram illustrating circuit configuration of a sub-pixel of a display panel used in the organic EL display device according to at least one embodiment.

FIG. 2 is a schematic circuit diagram illustrating circuit configuration in an organic EL element 100 corresponding to each of the sub-pixels 100se of the display panel 10 used in the display device 1 according to at least one embodiment.

As illustrated in FIG. 2, in the display panel 10 according to the present embodiment, each of the sub-pixels 100se includes two transistors $Tr_1$, $Tr_2$, one capacitor C, and an organic EL element portion EL as a light emitter. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain D2 of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element portion EL. A common electrode (counter electrode: cathode) of the organic EL element portion EL is connected to a ground line Vcat.

A first end of the capacitor C is connected to the drain D2 of the switching transistor $Tr_2$ and the gate $G_1$ of the drive transistor $Tr_1$, and a second end of the capacitor C is connected to the power source line Va.

In the display panel 10, a plurality of adjacent sub-pixels 100se (for example, three sub-pixels 100se that emit red (R), green (G), and blue (B) light) constitute a single unit pixel 100e, and the unit pixels 100e are distributed and arranged to constitute a pixel region. For each of the sub-pixels 100se, a gate line leads out from the gate $G_2$ and is connected to a scan line Vscn connected from outside the display panel 10. Similarly, for each of the sub-pixels 100se, a source line leads out from the source $S_2$ and is connected to a data line Vdat connected from outside the display panel 10.

Further, power source lines Va and ground lines Vcat of sub-pixels 100se are aggregated and connected to a power source line and a ground line of the display device 1.

(3) Overall Configuration of Display Panel 10

(3-1) Overview of Display Panel 10

The display panel 10 according to the present embodiment is described with reference to the drawings. Note that the drawings are schematic diagrams and are not necessarily to scale.

Figure 3:
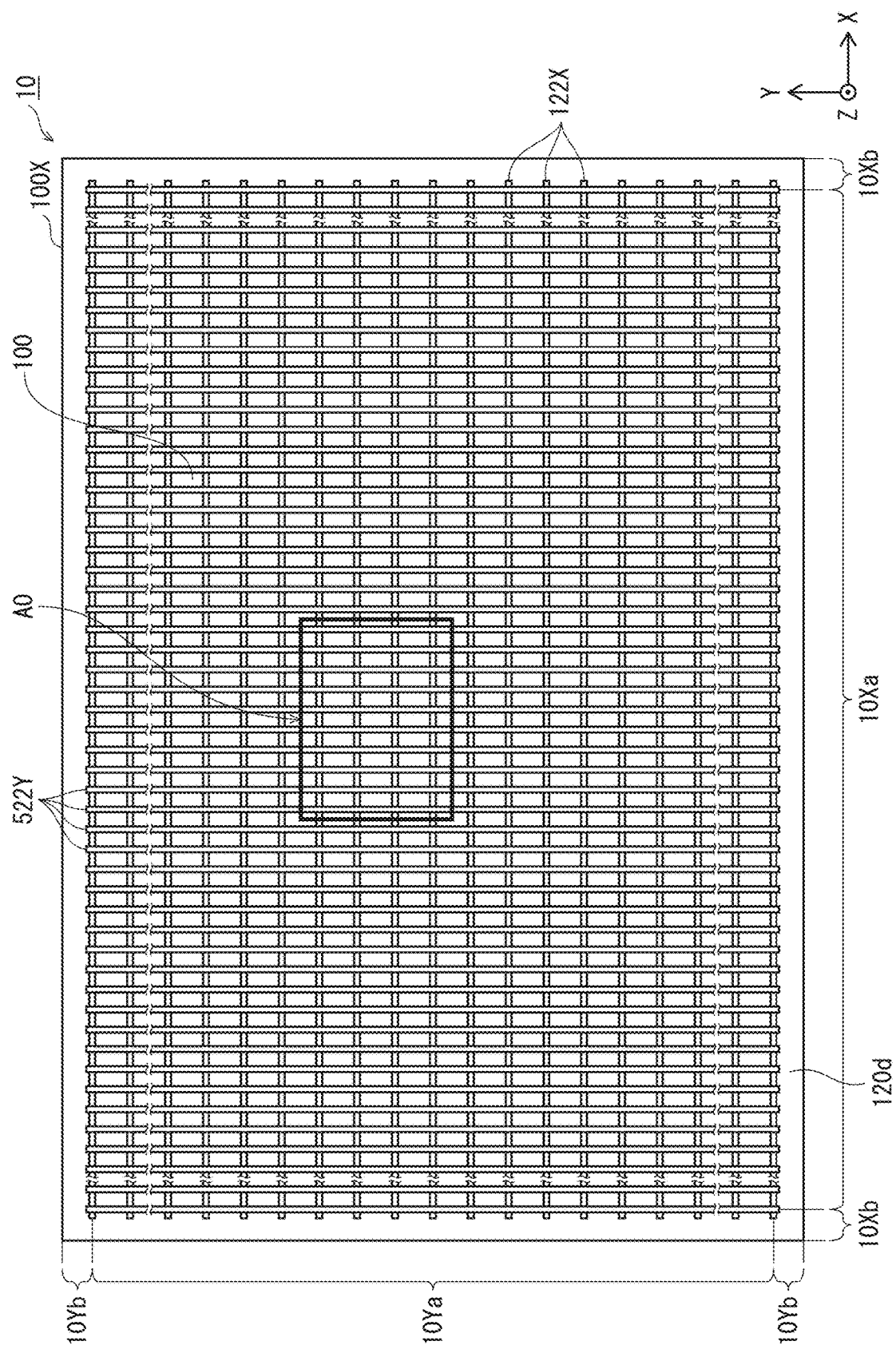
FIG. 3 is a schematic plan diagram of the display panel according to at least one embodiment.

FIG. 3 is a schematic plan view diagram of the display panel 10 according to at least one embodiment. The display panel 10 is an organic EL display panel that makes use of electroluminescence of an organic compound. The display panel 10 has a top-emission configuration in which light is emitted from a top surface thereof, and in which organic EL elements 100, which constitute pixels, are arranged in a matrix on a substrate 100x (TFT substrate) including thin film transistors (TFTs). Here, in the present description, the X direction, Y direction, and Z direction in FIG. 3 represent a row direction, column direction, and thickness direction of the display panel 10, respectively.

As illustrated in FIG. 3, the display panel 10 includes a partitioned region 10a (also referred to as a partitioned region 10Xa, 10Ya in terms of the X, Y directions) in which column banks 522Y and row banks 122X (row insulating layers) are arranged, defining light emission units of RGB colors in a matrix on the substrate 100x and a non-partitioned region 10b (also referred to as a non-partitioned region 10Xb, 10Yb in terms of the X, Y directions) surrounding the partitioned region 10a. An outer peripheral edge in the column direction of the partitioned region 10a corresponds to ends in the column direction of the column banks 522Y. In the non-partitioned region 10b, a rectangular sealing member (not illustrated) surrounds the partitioned region 10a.

(3-2) Overview of Organic EL Elements 100

Figure 4:
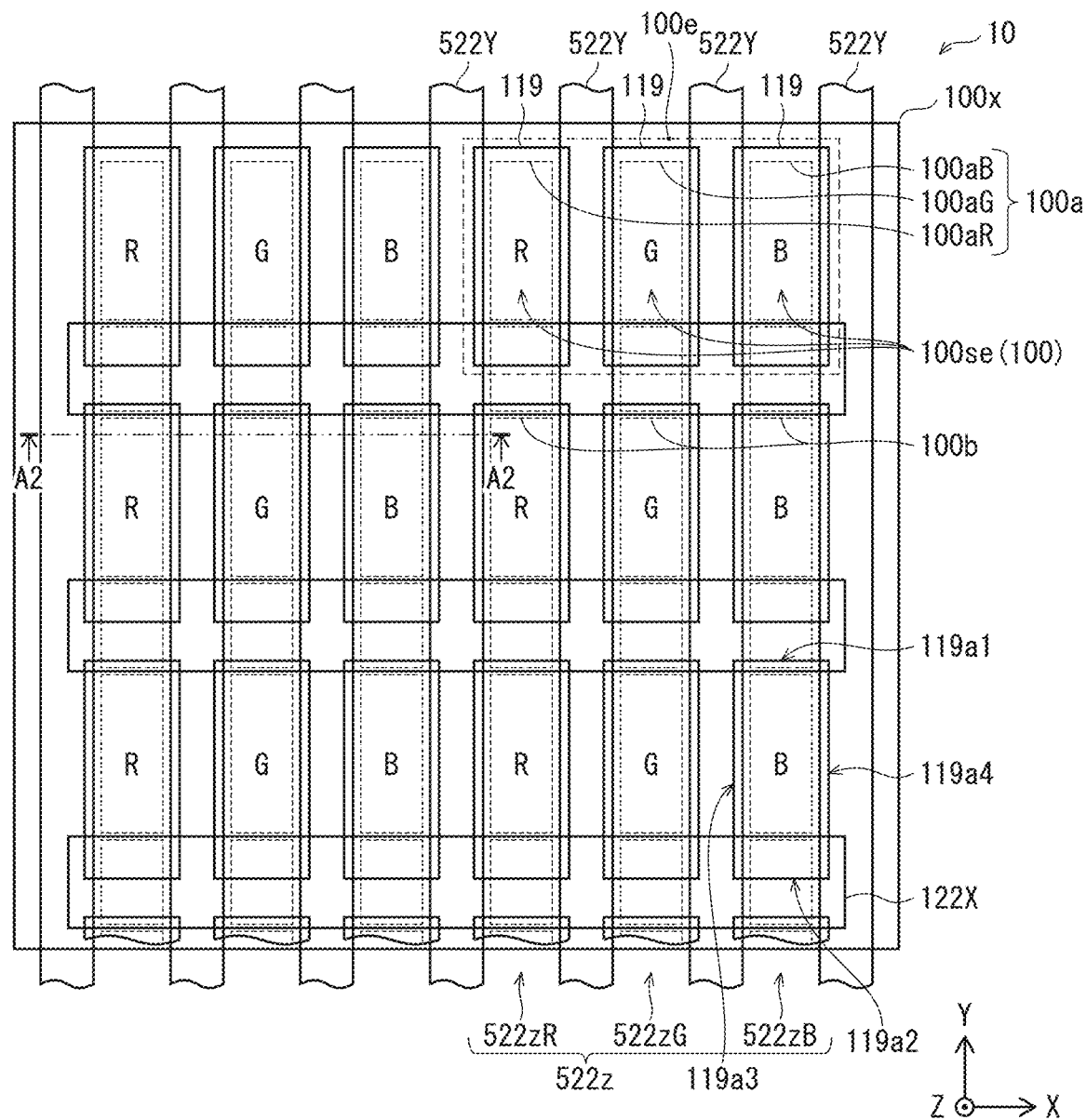
FIG. 4 is an enlarged plan view diagram of a portion AO from FIG. 3 according to at least one embodiment.

FIG. 4 is an enlarged plan view diagram of a portion AO from FIG. 3 according to at least one embodiment.

In the partitioned region 10a of the display panel 10, the unit pixels 100e, which are formed from organic EL elements 100, are arranged in a matrix. In each of the unit pixels 100e are a red-self-light-emission region 100aR, a green-self-light-emission region 100aG, and a blue-self-lightemission region 100aB (also referred to as self-light-emission regions 100a), the three self-light-emission regions 100a being regions that emit light due to an organic compound. In other words, three sub-pixels 100se corresponding to self-light-emission regions 100aR, 100aG, 100aB lined up in the row direction constitute one set or one of the unit pixels 100e in a color display.

In the display panel 10, pixel electrodes 119 are arranged in a matrix on the substrate 100x, separated from each other by a defined distances in the row and column directions. The pixel electrodes 119 are, for example, substantially rectangular in plan view, and are made of a light-reflective material. Three pixel electrodes 119 lined up in the row direction correspond to three self-light-emission regions 100aR, 100aG, 100aB lined up in the row direction.

Pixel electrodes 119 that are adjacent to each other are insulated from each other. Between adjacent pixel electrodes 119 are insulating layers that extend in a line shape.

The column banks 522Y extend in the column direction (Y direction in FIG. 3) and are arranged in a plurality of columns. Each of the column banks 522Y is above a region on the substrate 100x between pixel electrodes 119 adjacent to each other in the row direction (between an edge 119a3 in the row direction of one pixel electrode 119 and an edge 119a4 in the row direction of a pixel electrode 119 adjacent to the one pixel electrode 119). Thus, row direction edges of the self-light-emission regions 100a are defined by row direction edges of the column banks 522Y.

The row banks 122X extend in the row direction (X direction in FIG. 3) and are arranged in a plurality of rows. Each of the row banks 122X is above a region on the substrate 100x between pixel electrodes 119 adjacent to each other in the column direction (between an edge 119a1 in the column direction of one pixel electrode 119 and an edge 119a2 in the column direction of a pixel electrode 119 adjacent to the one pixel electrode 119). Regions in which the row banks 122X are present are non-self-light-emission regions 100b in which organic electroluminescence does not occur in the light emitting layers 123 above the pixel electrodes 119. Thus, column direction edges of the self-light-emission regions 100a are defined by column direction edges of the row banks 122X.

When gaps 522z are defined between column banks 522Y that are adjacent to each other, the gaps 522z include red gaps 522zR corresponding to the non-self-light-emission regions 100aR, green gaps 522zG corresponding to non-self-light-emission regions 100aG, and blue gaps 522zB corresponding to non-self-light-emission regions 100aB (red gaps 522zR, green gaps 522zG, and blue gaps 522zB are also referred to as "gaps 522z"). A large number of the column banks 522Y and the gaps 522z are arranged alternating across the display panel 10.

In the display panel 10, a plurality of self-light-emission regions 100a and non-self-light-emission regions 100b are arranged alternating in the column direction along the red gaps 522zR, the green gaps 522zG, and the blue gaps 522zB. In the non-self-light-emission regions 100b are connecting recesses (contact holes, not illustrated) that connect with the pixel electrodes 119 and the TFT sources S1, and with respect to the pixel electrodes 119, contact regions (contact windows, not illustrated) are provided on the pixel electrodes 119 for electrical connection.

In one sub-pixel 100se, the column banks 522Y provided in the column direction and the row banks 122X provided in the row direction are orthogonal, and the self-light-emission region 100a is located between row banks 122X that are adjacent to each other in the column direction.

Figure 5:
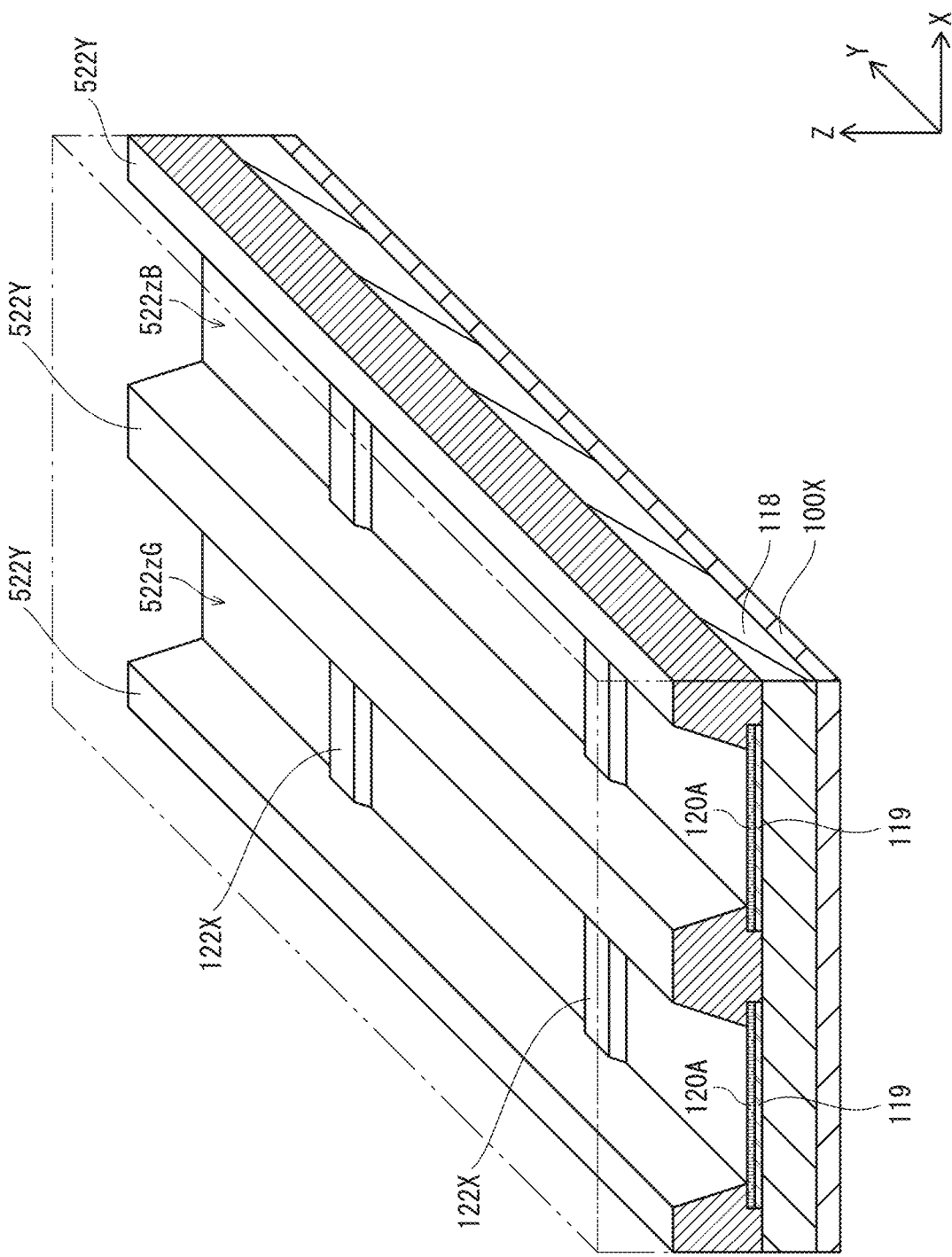
FIG. 5 is a perspective diagram of a substrate after forming of column banks and row banks according to at least one embodiment.

FIG. 5 is a partial perspective diagram of the display panel 10 according to at least one embodiment for describing how the column banks 522Y and the row banks 122X are formed. As illustrated in FIG. 5, the row banks 122X have a height sufficiently lower than the column banks 522Y (line bank structure). Due to this, liquid surfaces of the ink ejected from nozzles of an application device into the gaps 522zG and 522zB have a height higher than the row banks 122X. This allows the ink to flow in the column direction (Y direction) in order for the liquid surfaces of the ink to be levelled, thereby making variation of film thicknesses in the column direction smaller.

2. Application Device 200

(1) Configuration of Application Device 200

When the functional layers are formed by wet processes, an application device as described below is used as at least one embodiment of a device for forming functional layers (functional layer forming device).

Figure 6A:
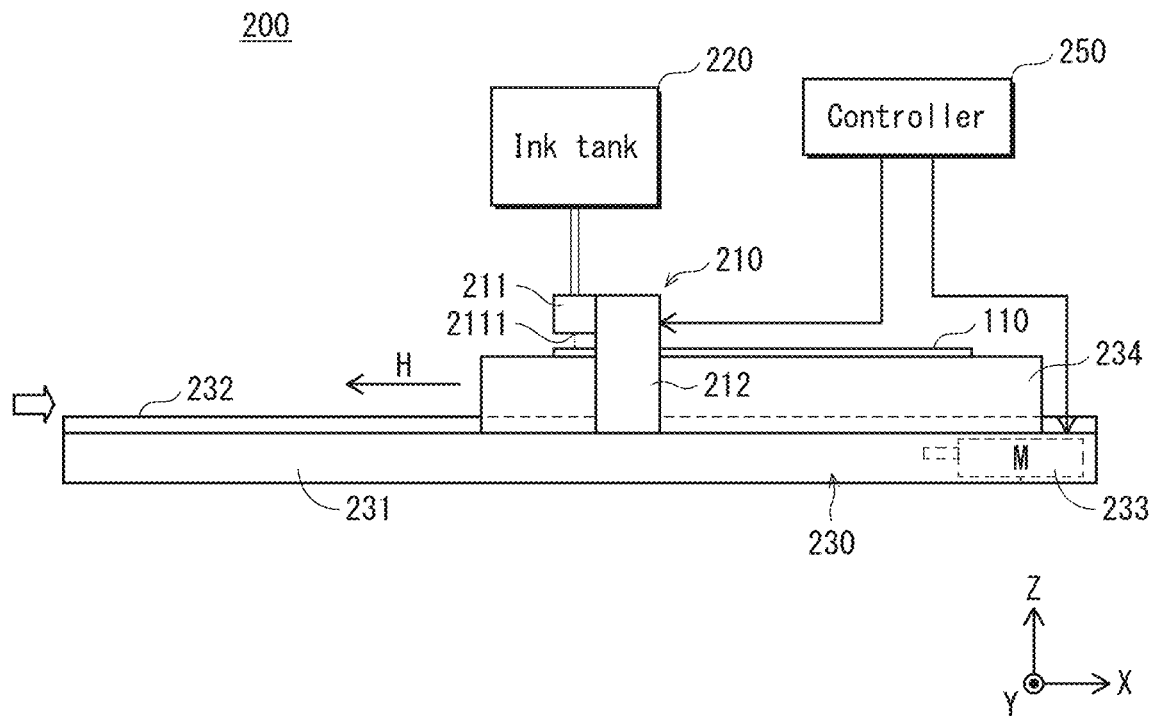
FIG. 6A is a side view diagram of an application device for light emitting layers according to at least one embodiment.
Figure 6B:
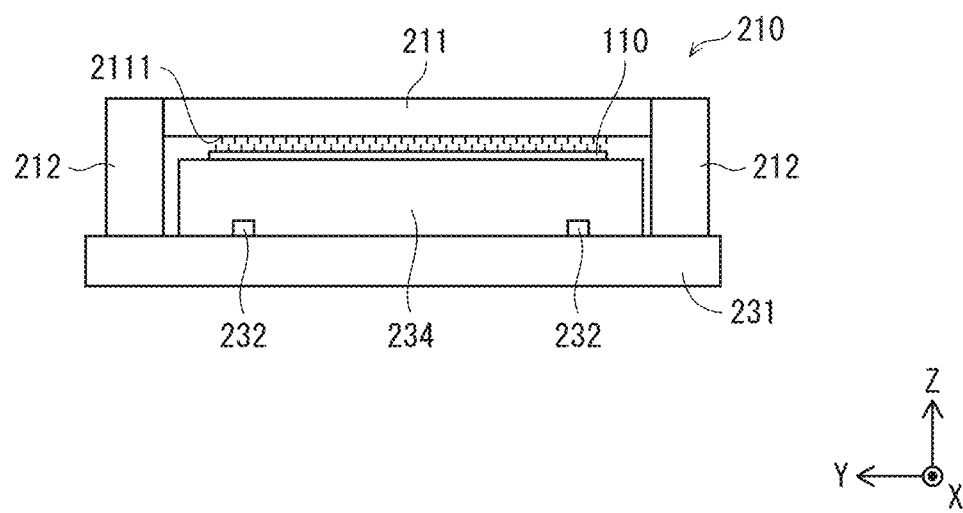
FIG. 6B is a front view diagram of the same.

FIG. 6A is a side view diagram illustrating an application device 200 according to at least one embodiment for applying ink including an organic light emitting material to the gaps 522z to form organic light emitting layers, and FIG. 6B is a front view diagram in which the application device 200 from FIG. 6A according to at least one embodiment is seen from the X direction.

As illustrated in FIG. 6A, the application device 200 includes an ink application unit 210 having an ink head 211, an ink tank 220 storing ink and supplying the ink to the ink head 211, a substrate moving unit 230, and a controller 250. The substrate moving unit 230 moves, in an H direction, a substrate 110 after forming of the column banks 522Y and the row banks 122X and before forming of the light emitting layers (intermediate product of the organic EL display panel 10; hereinafter referred to as "after-bank-forming substrate"). The controller 250 controls ink ejection of the ink head 211, timing at which the after-bank-forming substrate 110 is moved by the substrate moving unit 230, and a distance by which the after-bank-forming substrate 110 is moved by the substrate moving unit 230.

The ink application unit 210 includes a pedestal 231 that is placed horizontally and that has a pair of legs 212 standing on ends of the pedestal 231 in the Y direction, and the ink head 211 is disposed horizontally on upper portions the legs 212. The ink head 211 has a plurality of nozzles 2111 arranged in the column direction (Y direction) for ejecting ink droplets, and the nozzles 2111 are each configured to be driven by a piezoelectric element to eject ink droplets of a desired amount.

The substrate moving unit 230 includes a table 234 on which the after-bank-forming substrate 110 is placed, and the table 234 is placed on the pedestal 231 in order for the table 234 to be movable in the X direction through being guided by two guide rails 232 on a top surface of the pedestal 231.

A drive source such as a servo motor 233 is provided inside the pedestal 231, and the table 234 is movable along the guide rail 232 in the X direction through a known drive mechanism such as a screw feed mechanism or a wire drive mechanism.

The ink is applied by controlling, with use of the controller 250, ejection operation of the ink from the nozzles 2111 by the ink application unit 210 and by performing drive control of the servo motor 233 to move the after-bank-forming substrate 110 by a defined distance.

The ink head 211 is fixed and the after-bank-forming substrate 110 is moved in the X direction (row direction) in the present embodiment because the table 234, on which the after-bank-forming substrate 110 is placed, moves in the X direction through being guided by the two guide rails 232 on the top surface (reference plane) of the pedestal 231. Such a structure enables a more precise movement control and therefore ensures higher working accuracy compared to a structure in which the ink head 211, which is disposed horizontally on the upper portions the legs 212, is moved.

Note that the after-bank-forming substrate 110 need not be moved in some configuration of the application device and a configuration in which the ink head 211 is moved in the X direction is possible. That is, any configuration in which relative motion in the X direction between the ink head 211 and the after-bank-forming substrate 110 is caused is possible.

(2) Application Processes

Figure 7:
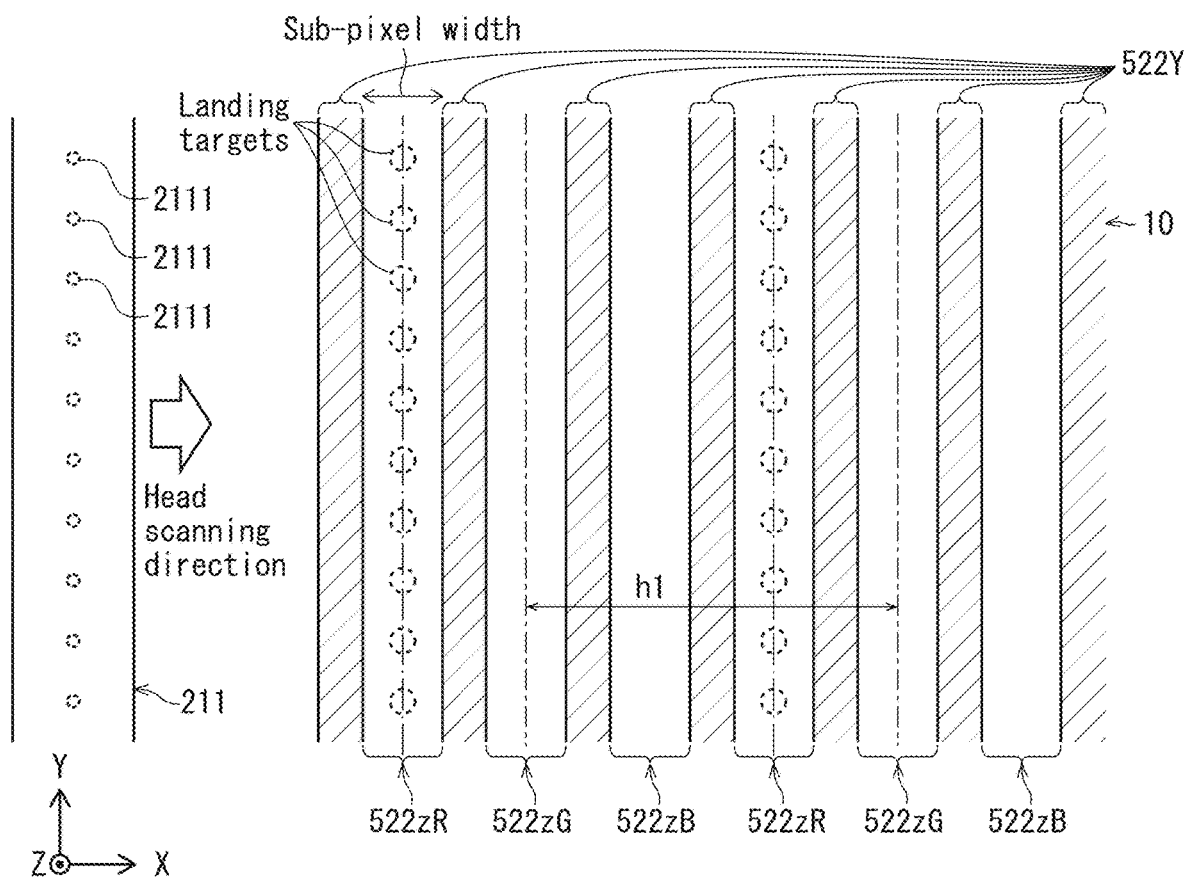
FIG. 7 is a schematic plan diagram of a process of applying ink for forming light emitting layers to gaps between adjacent column banks 522Y on a substrate.

FIG. 7 is a schematic diagram illustrating ejecting ink including a light emitting material from all the nozzles 2111 of the ink head 211 of the application device 200 according to at least one embodiment to apply the ink to the gaps 522z between the column banks 522Y that are adjacent in the row direction (X direction) on the substrate 100x.

Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied into the gaps 522z in order.

As a result, red light emitting layers, green light emitting layers, and blue light emitting layers repeatedly alternate across the substrate 100x in the row direction (X direction).

The substrate 100x is placed on the table 234 of the application device 200 with the column banks 522Y along the Y direction, and ink application is performed by ejecting the ink from the nozzles 2111 to land at landing targets that are set in the gaps 522z between the column banks 522Y while causing relative motion in the X direction between the substrate 100x and the ink head 211, which has the nozzles 2111 arranged parallel to the Y direction.

As described above, the row banks 122X, which extend in the X direction, have a height sufficiently lower than the column banks 122Y, and therefore the ink flows to an appropriate extent and is levelled in the gaps 522z. Accordingly, large amounts of unevenness in film thickness in the column direction are unlikely to occur, luminance evenness between pixels is improved, and uneven pixel lifespan reduction can be avoided.

When forming the light emitting layers in three colors of RGB such that the light emitting layers of each color have different film thicknesses, for example, an amount of ink to be ejected from nozzles is set according to a first condition and applied to a plurality of gaps of a first color, then an amount of ink to be ejected from nozzles is set according to a second condition and applied to a plurality of gaps of a second color, then an amount of ink to be ejected from nozzles is set according to a third condition and applied to a plurality of gaps of a third color, and in this way ink is sequentially applied to gaps of all three colors.

Further, ink may be sequentially applied to gaps of three colors by repeating a process of applying ink to gaps of a first color for a plurality of substrates, then applying ink to gaps of a second color for the plurality of substrates, then applying ink to gaps of a third color for the plurality of substrates.

Typically, ink is applied to the gaps 522z with use of all the nozzles 2111 of the ink head 211 as illustrated in FIG. 7. However, recently, demands for display panels having high resolution is increasing, and therefore widths between the gaps are becoming narrower, and an ink amount supplied to each of the gaps is becoming smaller. Further, when an optical resonator structure is implemented, the functional layers or the light emitting layers need to have small film thicknesses specifically for pixels emitting blue light, which has a short wavelength. Due to this, amounts of ink supplied to the gaps 522z are likely to become even smaller.

Meanwhile, amounts of ink dropped from the nozzles 2111 cannot be made smaller than a certain extent, and therefore amounts of ink supplied to the gaps 522z need to be adjusted by selecting nozzles used for ink ejection from among the nozzles 2111.

FIG. 8A is a diagram schematically illustrating how the nozzles used for ink ejection is selected in an example.

FIG. 8A illustrates a pattern of selection of the nozzles in an example in which a total number of the nozzles is 52 and use of eleven nozzles suffices to supply a desired ink amount.

The uppermost row in FIG. 8A indicates nozzle numbers, and the rows A through F in FIG. 8A indicate the gaps 522zG into which an ink of the same color (for example, ink for green light emission) is to be supplied, and the ink is supplied to the gaps (gap set) 522zG with use of the nozzles indicated by black ovals.

As can be seen from this example, the ink is supplied to each of the gaps 522zG with use of the same combination of the nozzles P0 (a "combination of nozzles" is hereinafter also referred to as a "nozzle pattern").

Even when a line bank structure is implemented, in cases in which the nozzles that do not eject ink are always the same, film thickness unevenness in the column direction occurs in the gaps 522zG in connection with other factors. This gives rise to streaks of luminance unevenness.

In view of this, in the present embodiment, as illustrated in FIG. 8B, control of changing nozzle patterns for ink ejection is performed in order for ink ejection into gaps that are in a sequence in the row direction among the gaps 522z of the same light emission color not to be performed with the same ones of the nozzles. In FIG. 8B, ones of the nozzles from which ink is ejected are each shifted by two nozzles in the column direction for each of the six columns from column A to column F, and the ink is applied into all the gaps 522z (in plan view, the gaps 522z can be regarded as elongated openings extending in the column direction, and therefore the gaps 522z are hereinafter also referred to as "column openings") of the same light emission color in the display panel 10 by repeatedly using the nozzle patterns for each six columns.

In such a configuration, a pattern of film thickness variation in the column direction occurring in a column opening is less likely to be continuous in the row direction with another pattern of film thickness variation in the column direction occurring in another column opening, and therefore occurrence of streaks of luminance unevenness of the same color can be suppressed.

(3) Configuration of Controller 250 and Flowchart of Application Control

Figure 9:
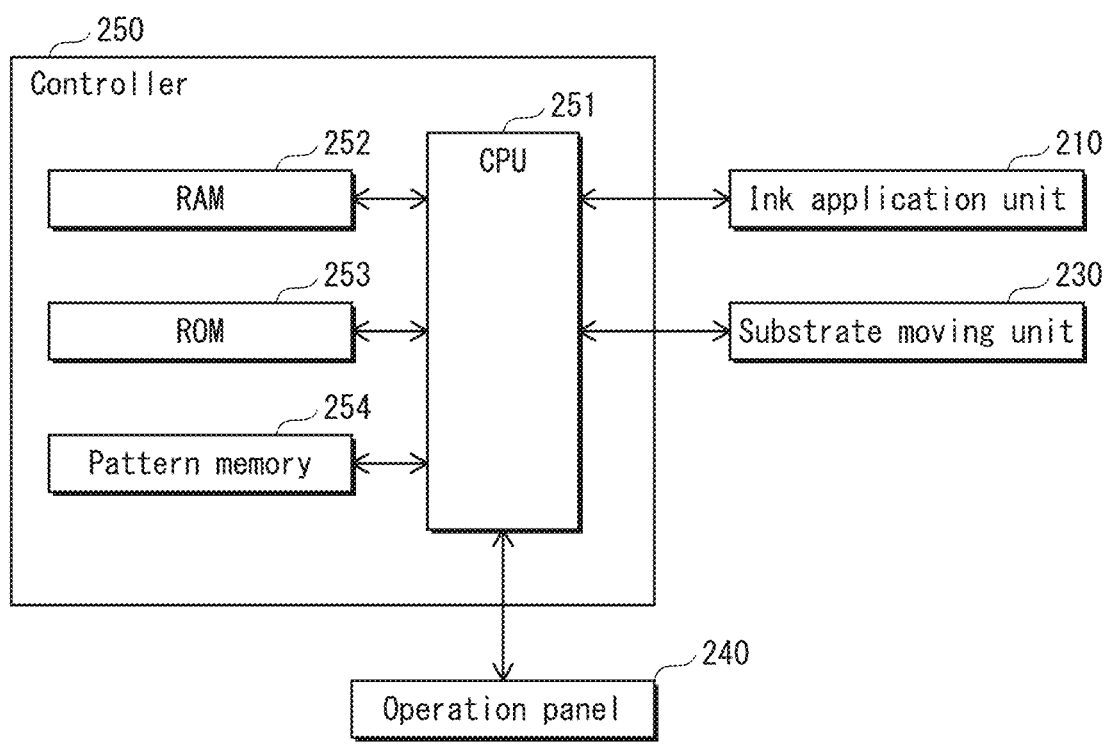
FIG. 9 is a block diagram of a configuration of a controller in the application device for light emitting layers according to at least one embodiment.

FIG. 9 is a block diagram illustrating a configuration of the controller 250 in the application device 200 according to at least one embodiment.

As illustrated in FIG. 9, the controller 250 includes components such as a central processing unit (CPU) 251, a random-access memory (RAM) 252, a read-only memory (ROM) 253, and a pattern memory 254.

Upon receiving an instruction from a user through an operation panel 240, the CPU 251 reads out a program for application control from the ROM 253, executes the program while using the RAM 252 as a working memory area, and performs operations such as selection of the nozzles used for ink ejection by the ink application unit 210 and control of movement of the after-bank-forming substrate 110 by the substrate moving unit 230. Specifically, when control of selecting the nozzles used for ink ejection and supplying ink is performed, the CPU 251 functions as the "supply controller" of the present disclosure.

Figure 10:
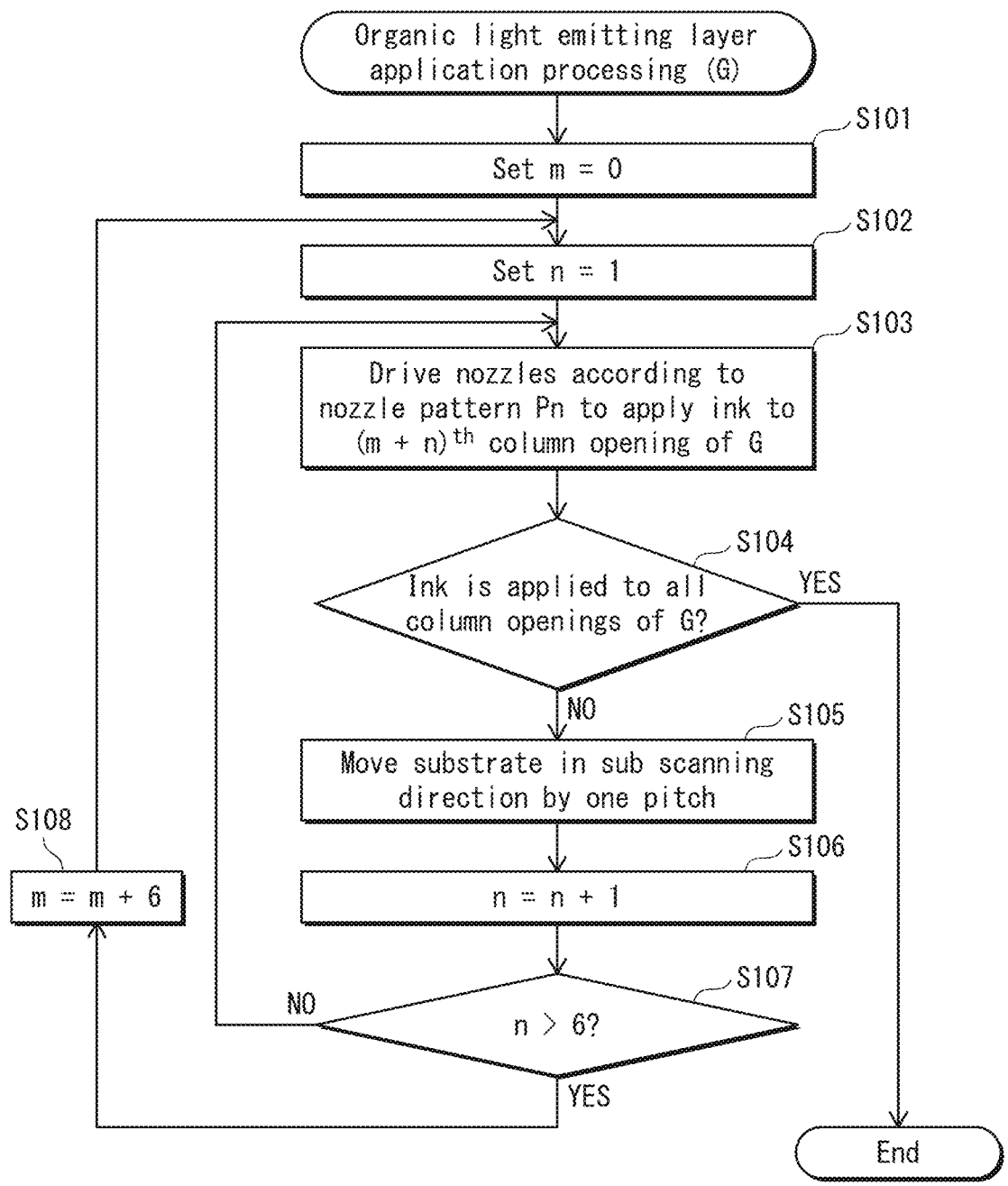
FIG. 10 is a flowchart of how the controller from FIG. 9 controls application processes of the application device according to at least one embodiment.

FIG. 10 is a flowchart illustrating steps of how the controller 250 according to at least one embodiment controls application processing of green (G) organic light emitting layers.

Firstly, a variable m is set to 0 (step S101), and then a variable n is set to 1 (step S102).

Then, the nozzles according to a nozzle pattern Pn are driven in a sequence to apply ink to a $(m+n)^{th}$ column opening (step S103). Here, the values are still m=0 and n=1, and therefore the ink is applied to the first column opening (column A) with use of the nozzle pattern P1 (see the nozzle pattern P1 of column A of FIG. 8B).

Then, determination is made of whether or not the ink is applied to all of the green (G) column openings (step S104). When the ink is not applied to all of the green (G) column openings (step S104: NO), the after-bank-forming substrate 110 is moved by the substrate moving unit 230 in a sub scanning direction (H direction of FIG. 6A) by a pitch (here, a pitch is a distance h1 between centers of green sub-pixels that are in a sequence in the X direction (see FIG. 7)) (step S105), and the value of n is incremented by one (step S106). When the value of n after incrementing does not exceed six (step S107: NO), the processing returns to step S103 and ink application is performed for the $(m+n)^{th}$ column opening by using the nozzle pattern Pn.

When n>6 in step S107 (step S107: YES), in order to return to the nozzle pattern P1, the value of m is incremented by six in step S108 and the processing returns to step S102 to reset n to one. Due to this, ink application to the seventh column opening is performed by using the nozzle pattern P1.

The ink is sequentially applied to the column openings to which a green light emitting material is to be applied while repeatedly using the six nozzle patterns P1 through P6. When determination is made that ink is applied to all the green column openings in step S104 (step S104: YES), green organic light emitting layer application processing ends.

Then, the organic light emitting layer application processing described above is repeatedly performed for the other colors. Here, another application device 200 whose ink tank 220 stores ink including a light emitting material of a different color (a different kind of ink) may be used; alternatively, the application device 200 used for the green light emitting layer application processing may be used with its ink tank used for the green light emitting layer application processing being replaced with an ink tank storing an ink of a different color.

Figure 11:
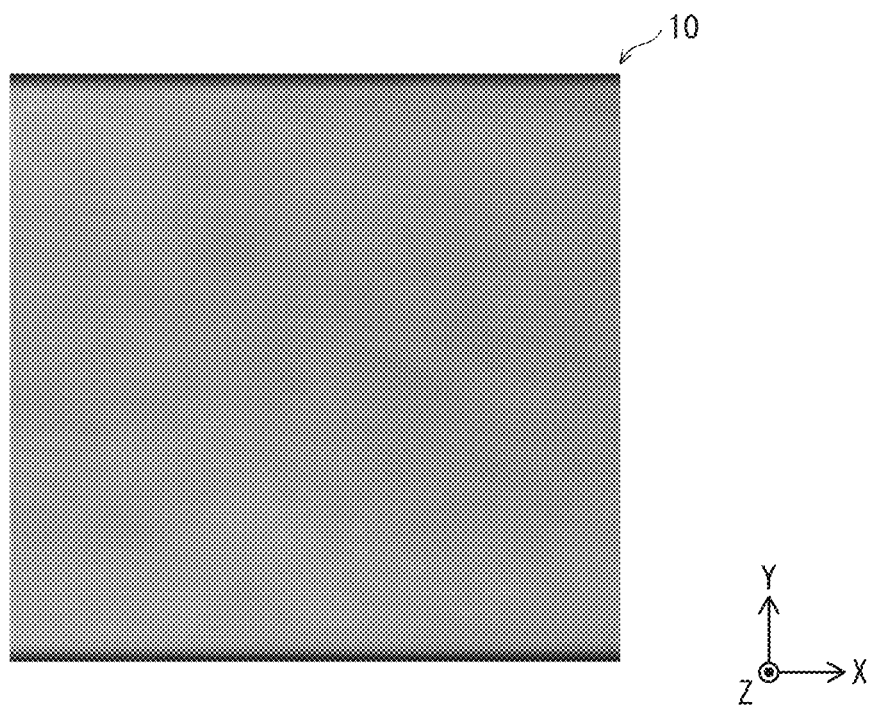
FIG. 11 is a photograph illustrating a display image of an organic EL panel formed by using a manufacturing method according to at least one embodiment.

FIG. 11 is a photograph illustrating a display image of the display panel 10 that includes the light emitting layers formed by using the above application method according to at least one embodiment and that is caused to emit light (a region in the X direction and the Y direction corresponding to FIG. 20A is illustrated). As can be seen in FIG. 11, according to the present embodiment, streaks of luminance unevenness parallel with a nozzle scanning direction is much more inconspicuous compared to the example in FIG. 20A.

3. Configuration of Display Panel 10

Figure 12:
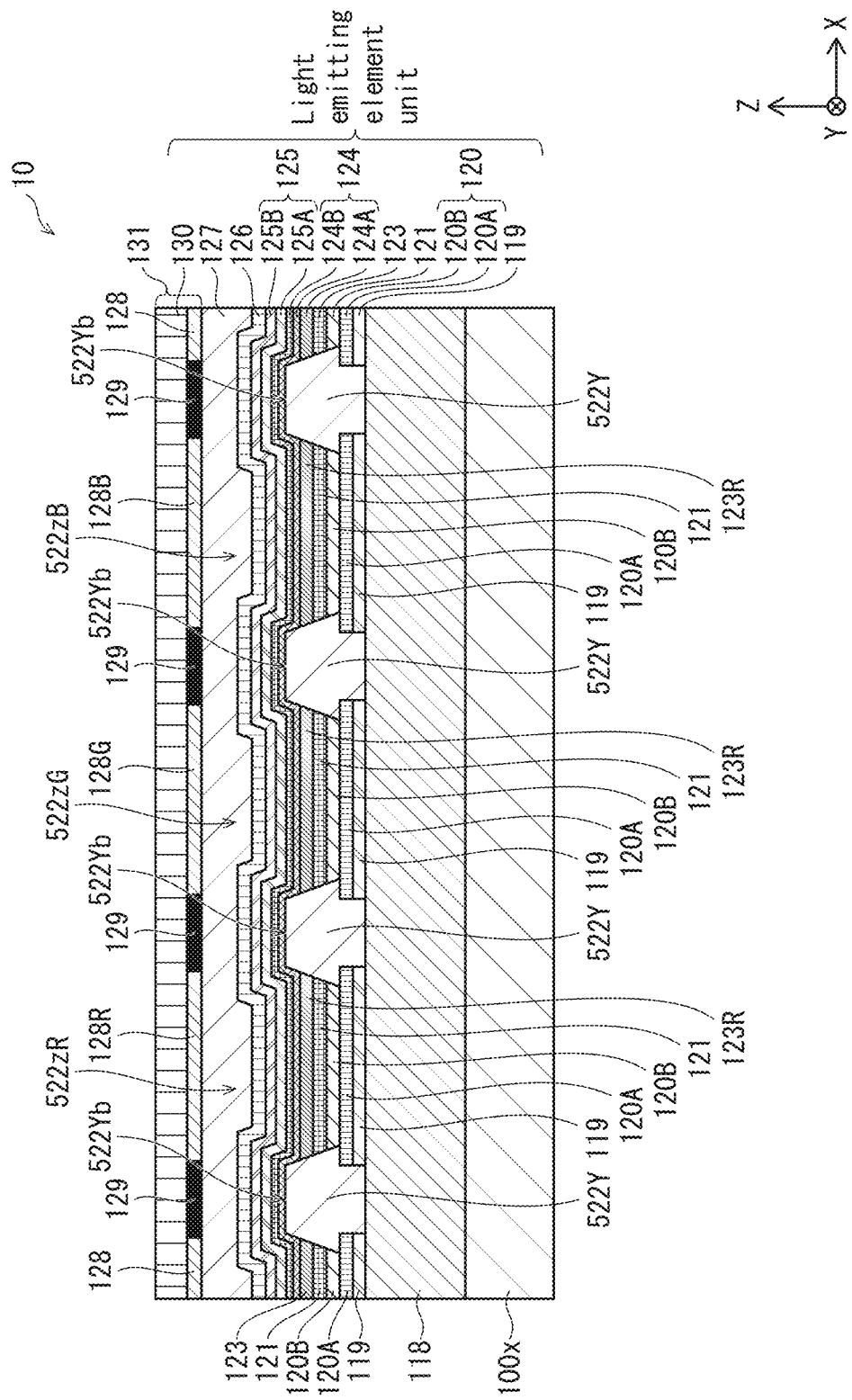
FIG. 12 is a schematic cross section diagram taken along A2-A2 in FIG. 4 illustrating the organic EL panel according to at least one embodiment.

FIG. 12 is a schematic partial cross section diagram taken along A2-A2 in FIG. 4 illustrating the display panel 10 according to at least one embodiment.

The display panel 10 pertaining to the present embodiment includes: a substrate (TFT substrate) having thin film transistors at a lower portion of the display panel 10 relative to the Z direction; and a plurality of organic EL elements arranged on the substrate.

(1) Substrate 100x

The substrate 100x is a support member of the display panel 10 and includes a base (not illustrated) and a thin film transistor layer (not illustrated) on the base.

The base is a support member of the display panel 10, and is a flat plate. As a material of the base, an electrically insulating material such as a glass material, a resin material, a semiconductor material, or a metal material coated with an insulating layer can be used.

The TFT layer includes TFTs and wiring (connecting sources $S_1$ of the TFTs to corresponding pixel electrodes 119) formed on a top surface of the base. TFTs electrically connect corresponding pixel electrodes 119 to an external power source in response to a drive signal from an external circuit of the display panel 10, and have multilayer structures including an electrode, a semiconductor layer, an insulating layer, and the like.

(2) Planarizing Layer 118

A planarizing layer 118 is provided on a top surface of the substrate 100x. The planarizing layer 118 on the top surface of the substrate 100x planarizes the top surface of the substrate 100x, which is irregular due to the TFT layer. Further, the planarizing layer 118 fills between wiring and TFTs, electrically insulating between the wiring and TFTs.

In order to connect the pixel electrodes 119 to wiring connected to the sources $S_1$ of corresponding pixels, the planarizing layer 118 is provided with contact holes (not illustrated) above portions of the wiring.

(3) Pixel Electrodes 119

As FIG. 4 illustrates, the pixel electrodes 119 are formed in units of the sub-pixels 100se on the planarizing layer 118 disposed on the upper surface of the substrate 100x.

The pixel electrodes 119 supply carriers to the light emitting layers 123. For example, if functioning as anodes, the pixel electrodes 119 supply holes to the light emitting layers 123. Further, the display panel 10 is a top-emission type, and therefore the pixel electrodes 119 are light reflective. The pixel electrodes 119 have, for example, a flat substantially rectangular plate shape in plan view. In contact holes (not illustrated) of the planarizing layer 118 are formed connecting recesses (not illustrated) of the pixel electrodes 119 that are portions of the pixel electrodes 119 recessed towards the substrate 100x, and at bottoms of the connecting recesses the pixel electrodes 119 are connected to wiring connected to sources $S_1$ of corresponding pixels.

(4) Hole Injection Layers 120

As illustrated in FIG. 12, hole injection layers 120 are layered on the pixel electrodes 119. The hole injection layers 120 have a function of transporting holes injected from the pixel electrode layers 119 to hole transport layers 121.

Each of the hole injection layers 120 includes, in order from a side nearest the substrate 100x, a hole injection layer 120A made of a metal oxide formed on a corresponding one of the pixel electrodes 119 and a hole injection layer 120B made of an organic material layered on the hole injection layer 120A in the gaps 522zR, 522zG, 522zB.

According to the present embodiment, the hole injection layers 120B each have a linear shape and extend in the column direction in the gaps 522zR, 522zG and 522zB. However, the hole injection layers 120B may be discontinuous in the column direction in the gaps 522z, i.e., provided only on the hole injection layers 120A on the pixel electrodes 119.

(5) Banks 122

Banks made of an insulating material are formed so as to cover edges of the pixel electrodes 119 and the hole injection layers 120. As illustrated in FIG. 4, the banks include the column banks 522Y that extend in the column direction and are arranged side-by-side in the row direction and the row banks 122X that extend in the row direction and are arranged side-by-side in the column direction. The column banks 522Y extend in the column direction that is orthogonal to the row banks 122X, the column banks 522Y and the row banks 122X forming a lattice shape (the row banks 122X and the column banks 522Y are also referred to as "banks 122").

The row banks 122X each have a line shape extending in the row direction, and in a cross-section taken parallel to the column direction the row banks 122X each have a tapered trapezoid shape that tapers upwards. The row banks 122X pass through the column banks 522Y and extend along the row direction, which is orthogonal to the column direction. The row banks 122X have a top surface that is lower than a top surface 522Yb of the column banks 522Y.

The row banks 122X are for controlling flow in the column direction of ink containing an organic compound that is a material of the light emitting layers 123. Thus, the row banks 122X have lyophilicity with respect to the ink of at least a defined value. Accordingly, the row banks 122X help suppress variation in ink amount between sub-pixels.

The row banks 122X are present above edges in the column direction (Y direction) of the pixel electrodes 119, and thereby help prevent electrical leaks between the pixel electrodes 119 and a common electrode 125. Base portions in the column direction of the row banks 122X define edges of the self-light-emission regions 100a of the sub-pixels 100se in the column direction.

The column banks 522Y each have a line shape extending in the column direction, and in a cross-section taken parallel to the row direction the column banks 522Y each have a tapered trapezoid shape that tapers upwards. The column banks 522Y block flow of ink in the row direction, the ink including an organic compound that is a material of the light emitting layers 123. Thus, the column banks 522Y define the row direction edges of the light emitting layers 123.

The column banks 522Y are present above edges in the row direction of the pixel electrodes 119, and thereby help prevent electrical leaks between the pixel electrodes 119 and the common electrode 125. Base portions in the row direction of the column banks 522Y define edges of the self-light-emission regions 100a of the sub-pixels 100se in the row direction.

The column banks 522Y have liquid repellency with respect to the ink of at least a defined value.

(6) Hole Transport Layers 121

As illustrated in FIG. 12, the hole transport layers 121 are layered on the hole injection layers 120 in the gaps 522zR, 522zG, 522zB. Further, the hole transport layers 121 are also layered on the hole injection layers 120 on the row banks 122X (not illustrated). The hole transport layers 121 are in contact with the hole injection layers 120B. The hole transport layers 121 have a function of transporting holes injected from the hole injection layers 120 to the light emitting layers 123.

According to the present embodiment, a configuration is adopted in which the hole transport layers 121 each have a line shape extending in the column direction in the gaps 522z, in a similar manner to the hole injection layers 120B.

(7) Light Emitting Layers

As illustrated in FIG. 12, the light emitting layers 123 are layered on the hole transport layers 121. The light emitting layers 123 are layers made of an organic compound, and have a function of emitting light through recombination of holes and electrons that occurs in the light emitting layers 123. In the gaps 522zR, 522zG and 522zB defined by the column banks 522Y, the light emitting layers 123 each have a linear shape extending in the column direction.

In the red gaps 522zR (see FIG. 4) corresponding to the self-light-emission regions 100aR in the red sub-pixels 100seR, the green gaps 522G corresponding to the self-light-emission regions 100aG in the green sub-pixels 100seG, and the blue gaps 522zB corresponding to the self-light-emission regions 100aB in the blue sub-pixels 100seB are light emitting layers 123R, 123G, 123B, respectively, that emit light of corresponding colors.

Only portions of the light emitting layers 123 that are supplied carriers from the pixel electrodes 119 emit light, and therefore in regions in which the row banks 122X, which are insulators, are present between layers, organic compound electroluminescence does not occur. Thus, only portions of the light emitting layers 123 where the row banks 122X are not present emit light, such portions are the self-light-emission regions 100a, and edges of the self-light-emission regions 100a in the column direction are defined by column-direction edges of the row banks 122X.

The light emitting layers 123 extend continuously not only in the self-light-emission regions 100a but also across the non-self-light-emission regions 100b that are adjacent in the column direction. In this way, when forming the light emitting layers 123, ink applied to the self-light-emission regions 100a can flow in the column direction via ink applied to the non-self-light-emission regions 100b, making equalizing of film thickness between pixels in the column direction possible. However, in the non-self-light-emission regions 100b, ink flow is suppressed to an appropriate extent by the row banks 122X. Accordingly, large amounts of unevenness in film thickness in the column direction are unlikely to occur, and luminance evenness between pixels is improved.

(8) Electron Transport Layer

As illustrated in FIG. 4 and FIG. 12, the electron transport layer 124 is layered covering the column banks 522Y and the gaps 522z defined by the column banks 522Y. The electron transport layer 124 is continuous across at least the entire display area of the organic EL display panel 10.

The electron transport layer 124 includes, in order from the substrate 100x, an electron transport layer 124A made of a metal oxide, fluoride, or the like, and an electron transport layer 124B that is primarily an organic substance layered on the electron transport layer 124A (collectively also referred to as "the electron transport layer 124").

As illustrated in FIG. 12, the electron transport layer 124 is formed on the light emitting layers 123. The electron transport layer 124 has a function of transporting electrons from the common electrode 125 to the light emitting layers 123 and a function of restricting injection of electrons into the light emitting layers 123.

(9) Common Electrode 125 (Counter Electrode)

As illustrated in FIG. 12, the common electrode 125 is formed on the electron transport layer 124. The common electrode 125 is an electrode common to the light emitting layers 123. The common electrode 125 includes, in this order from the substrate 100x, a common electrode 125A made of a metal oxide and a common electrode 125B that is primarily metal layered on the common electrode 125A (collectively also referred to as "common electrode 125").

As illustrated in FIG. 12, the common electrode 125 is also in a region above the pixel electrodes 119 on the electron transport layer 124. The common electrode 125 forms a conduction path paired with the pixel electrodes 119, sandwiching the light emitting layers 123. The common electrode 125 supplies carriers to the light emitting layers 123. For example, in the case of the common electrode 125 functioning as a cathode, it supplies electrons to the light emitting layers 123.

(10) Sealing Layer 126

The sealing layer 126 covers the common electrode 125. The sealing layer 126 is for suppressing deterioration of the light emitting layers 123 caused by contact with moisture, air, and the like. The sealing layer 126 is formed to cover the top surface of the common electrode 125.

(11) Joining Layer 127

Above the sealing layer 126 in the Z direction is a color filter substrate 131 including an upper substrate 130 and a color filter layer 128 disposed below the upper substrate 130 in the Z direction. The joining layer 127 has a function of joining the color filter substrate 131 to a "back panel" consisting of each layer from the substrate 100x to the sealing layer 126, and has a function of preventing each layer from being exposed to moisture and air.

(12) Color Filter (CF) Substrate 131

The color filter substrate 131, which includes the upper substrate 130 and the color filter layer 128, is disposed on and joined to the joining layer 127. The display panel 10 is a top-emission type of panel and therefore, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like.

The color filter layer 128 is formed on the upper substrate 130 at positions corresponding to each of the self-light-emission regions 100a of pixels. The color filter layer 128 is a light-transmissive layer provided for allowing transmission of visible light of wavelengths corresponding to R, G, and B and has a function of transmitting light emitted from each color pixel and correcting chromaticity of the transmitted light. For example, according to the present embodiment, red, green, and blue color filter layers 128R, 128G, and 128B are formed above self-light-emission regions 100aR in the red gaps 522zR, the self-light-emission regions 100aG in the green gaps 522zG, and the self-light-emission regions 100aB in the blue gaps 522zB, respectively.

The light shielding layer 129 is formed on the upper substrate 130 in positions corresponding to boundaries between self-light-emission regions 100a of pixels. The light shielding layer 129 is a black resin layer provided to prevent transmission of visible light of wavelengths corresponding to R, G, and B. For example, the light shielding layer is made of a resin material including black pigment with excellent light absorption and light shielding properties.

4. Method of Manufacturing Display Panel 10

Figure 13:
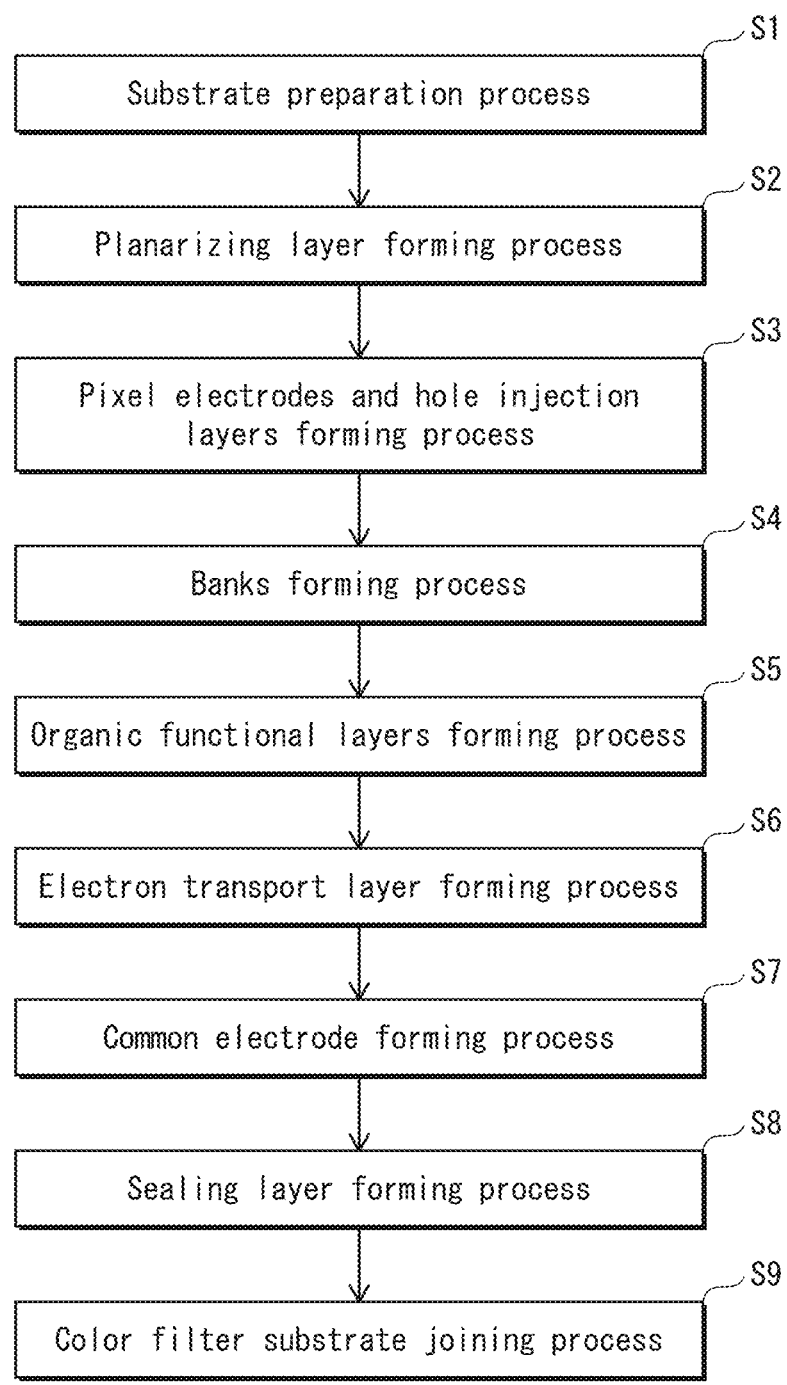
FIG. 13 is a flowchart illustrating manufacturing processes of a display panel according to at least one embodiment.

A method of manufacturing the display panel 10 is described with reference to flowchart of FIG. 13 illustrating processes of manufacturing the display panel 10 according to at least one embodiment and FIG. 14A, FIG. 14B, FIG. 14C, FIG. 14D, FIG. 15A, FIG. 15B, FIG. 15C, FIG. 16A, FIG. 16B, FIG. 16C, FIG. 16D, FIG. 17A, FIG. 17B, FIG. 17C, FIG. 17D, FIG. 17E, FIG. 17F, FIG. 17G, FIG. 18A, and FIG. 18B that are each a schematic cross section diagram illustrating a state in a process of manufacturing the display panel 10 according to at least one embodiment.

(1) Substrate Preparation Process (FIG. 13: Step S1)

Figure 14A:
FIG. 14A, FIG. 14B, FIG. 14C, and FIG. 14D are schematic cross section diagrams illustrating processes in manufacturing of the display panel according to at least one embodiment.

The substrate 100x on which TFTs and wiring are formed is prepared. The substrate 100x can be manufactured by using a publicly known TFT manufacturing method (FIG. 14A).

(2) Planarizing Layer Forming Process (FIG. 13: Step S2)

Figure 14B:

The planarizing layer 118 is formed by coating the substrate 100x with a component material (photosensitive resin material) of the planarizing layer 118 as a photoresist, and by planarizing the coated surface (FIG. 14B).

(3) Pixel Electrodes and Hole Injection Layers Forming Process (FIG. 13: Step S3)

After forming a metal film by using a vapor phase growth method such as sputtering or vacuum deposition, patterning is performed by using photolithography and etching.

Figure 14C:
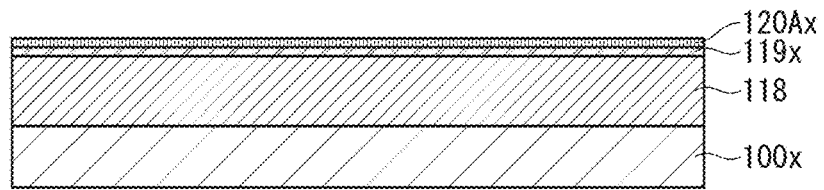

More specifically, first, dry etching processing is applied to a surface of the planarizing layer 118 to perform cleaning prior to film formation. Next, a second metal layer 119x for forming the pixel electrodes 119 is formed on the surface of the planarizing layer 118 by using a vapor phase growth method (FIG. 14C). According to the present embodiment, the second metal layer 119x is a film made of aluminum or an alloy that is primarily aluminum formed by using a sputtering method.

After pre-film-formation cleaning of a surface of the second metal layer 119x, a third metal layer 120Ax for forming the hole injection layers 120A is formed on the surface of the second metal layer 119x by using a vapor phase growth method (FIG. 14C). According to the present embodiment, the third metal layer 120Ax is formed by sputtering tungsten.

Figure 14D:
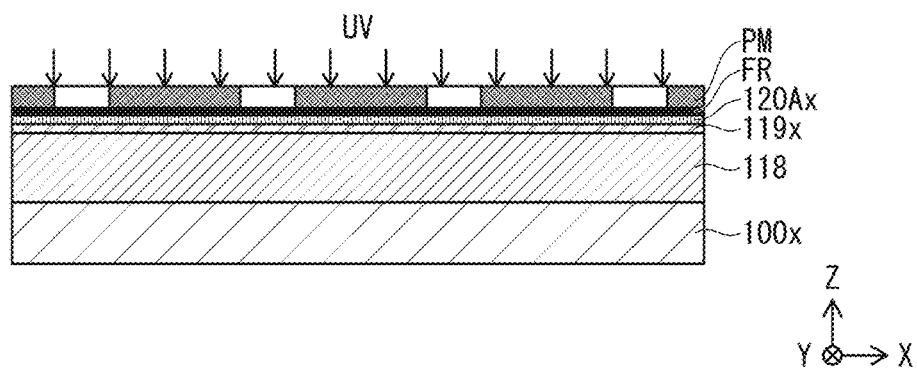

Subsequently, after applying a photoresist layer FR made of a photosensitive resin or the like, a photomask PM provided with defined openings is disposed thereon and irradiated with ultraviolet light to expose the photoresist and transfer the pattern of the photomask PM to the photoresist (FIG. 14D). Next, the photoresist layer FR is patterned by developing.

Subsequently, patterning of the third metal layer 120Ax and the second metal layer 119x is performed by etching processing via the patterned photoresist layer FR, thereby forming the hole injection layers 120A and the pixel electrodes 119.

Figure 15A:
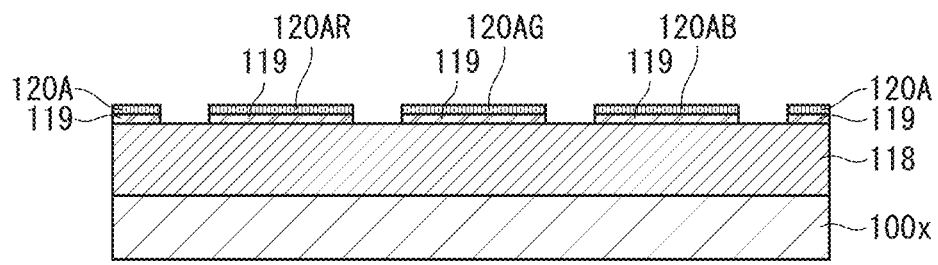
FIG. 15A, FIG. 15B, and FIG. 15C are schematic cross section diagrams illustrating processes in manufacturing of the display panel according to at least one embodiment, continuing from FIG. 14D.

Finally, the photoresist layer FR is peeled off, leaving the pixel electrodes 119 and the hole injection layers 120A patterned in the same shapes (FIG. 15A).

(4) Banks Forming Process (FIG. 13: Step S4)

Figure 15B:
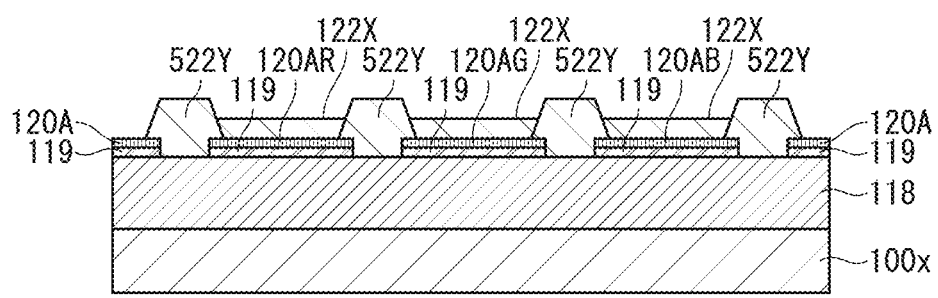
Figure 15C:
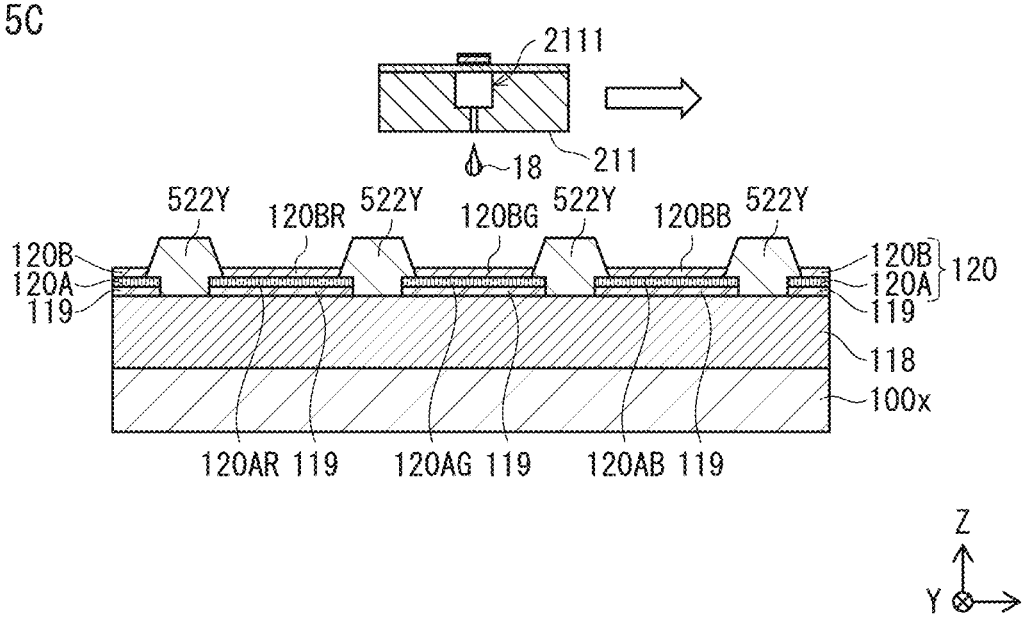

After forming the hole injection layers 120A of the hole injection layers 120, the banks that cover the hole injection layers 120A are formed. In forming the banks, first the row banks 122X are formed and subsequently the column banks 522Y are formed, thereby forming the gaps 522z (FIG. 15B).

To form the banks 122X, first, a film made of a material of the banks 122 (for example, a photosensitive resin material) is layered on the hole injection layers 120A by using a spin coating method or the like. Then the resin film is patterned to form the row banks 122X.

Patterning of the row banks 122X is performed by light exposure using a photomask above the resin film, developing, and baking (at approximately 230° C. for approximately 60 minutes).

Next, to form the column banks 522Y, a film made of a material of the column banks 522Y (for example, a photosensitive resin material) is layered on the hole injection layers 120A and the row banks 122X by using a spin coating method or the like. Forming the gaps 522z is performed by positioning a mask above the resin film, exposing it to light, then developing to pattern the resin film to form the gaps 522z and the column banks 522Y.

More specifically, when forming the column banks 522Y, a photosensitive resin film made of an organic photosensitive resin material such as acrylic resin, polyimide resin, novolac-type phenolic resin, or the like is formed. After drying to partially volatize solvent, a photomask provided with defined openings is overlaid, and ultraviolet irradiation is performed from above to expose a photoresist made of the photosensitive resin or the like, transferring the pattern of the photomask to the photoresist.

Next, insulating layers that are the column banks 522Y patterned by developing of the photosensitive resin are baked (at approximately 230° C. for approximately 60 minutes). Typically, a positive type of photoresist is used. According to a positive type of photoresist, portions exposed to light are removed by developing. The unexposed portions of the photoresist under the pattern mask remain without being developed.

As described above, the hole injection layers 120A are patterned per pixel unit by using photolithography and etching after a film made of metal (for example, tungsten) is formed by using a vapor phase growth method such as sputtering or vacuum deposition, but it is in the baking of the row banks 122X and the column banks 522Y that the metal is oxidized to complete the hole injection layers 120A.

The column banks 522Y extend in the column direction and alternate in the row direction with the gaps 522z.

(5) Organic Functional Layers Forming Process (FIG. 13: Step S5)

On the hole injection layers 120A of the hole injection layers 120 formed in the gaps 522z defined by the column banks 522Y, organic functional layers such as the hole injection layers 120B of the hole injection layers 120, the hole transport layers 121, and the light emitting layers 123 are layered in this order.

The hole injection layers 120B are formed by using an inkjet method to apply an ink including an electrically conductive polymer material such as a poly(3,4-ethylenedioxythiophene) polystyrene sulfonate (PEDOT:PSS) into the gaps 522z defined by the column banks 522Y, then removing a solvent by volatilization (FIG. 15C) or by baking. Subsequently, patterning per pixel unit may be performed by using photolithography and etching.

The hole transport layers 121 are formed by using a wet process such as an inkjet method or gravure printing method to apply ink including a material of the hole transport layers 121 into the gaps 522z defined by the column banks 522Y, then removing a solvent by volatilization or by baking. The method of applying ink for forming the hole transport layers 121 into the gaps 522z is the same as the method used for the hole injection layer 120B.

Figure 16A:
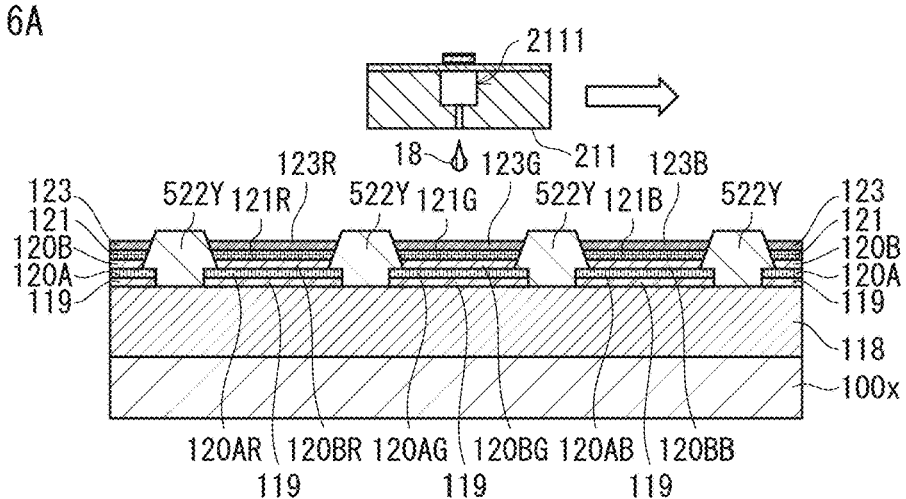
FIG. 16A, FIG. 16B, FIG. 16C, and FIG. 16D are schematic cross section diagrams illustrating processes in manufacturing of the display panel according to at least one embodiment, continuing from FIG. 15C.

The light emitting layers 123 are formed by using an inkjet method to apply ink including a material of the light emitting layers 123 into the gaps 522z defined by the column banks 522Y, then baking (FIG. 16A). More specifically, in this process, inks 123RI, 123GI, and 123BI including R, G, and B organic light emitting layer material, respectively, are applied by using an inkjet method into the gaps 522z, which are sub-pixel formation regions. The inks are then dried under low pressure and baked to form the light emitting layers 123R, 123G, and 123B.

Here, in application of the inks for the light emitting layers 123, occurrence of streaks of luminance unevenness is suppressed through applying the inks by using the method described above with use of the application device 200.

Note that any of the organic functional layers other than the light emitting layers 123, such as the hole injection layers 120B of the hole injection layers 120 and the hole transport layers 121, may be formed by using a method similar to forming of the light emitting layers 123 with use of the application device 200. In such a configuration, even when film thickness variation of these functional layers in the column direction occurs in the gaps 522z, such variation would not be continuous in the row direction, and therefore occurrence of streaks of luminance unevenness in the row direction is further suppressed.

(6) Electron Transport Layer Forming Process (FIG. 13: Step S6)

Figure 16B:
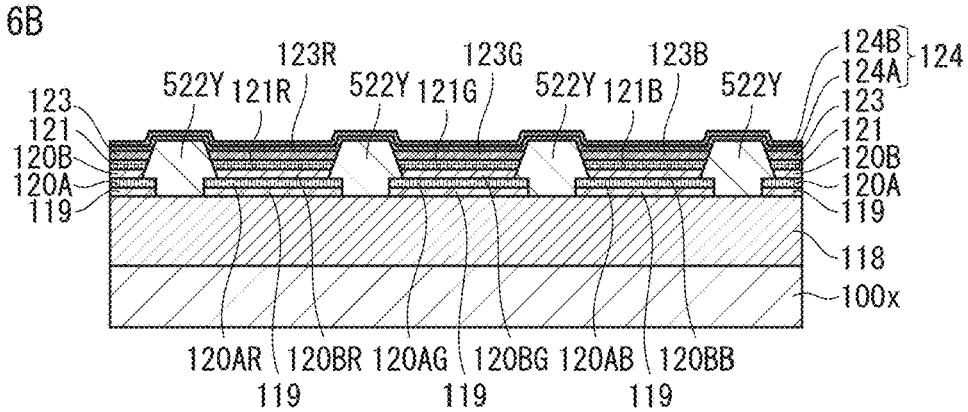

After forming the light emitting layers 123, the electron transport layer 124 is formed to be continuous across a light emitting area (display area) of the display panel 10 by using a method such as vacuum deposition (FIG. 16B).

Reasons for using vacuum deposition are to avoid damage to the light emitting layers 123, which are organic, and because, in a vacuum deposition method performed under high vacuum, molecules to form a film proceed directly in a direction normal to the substrate, and therefore an electron transport layer 124 having a uniform film thickness is likely to be formed easily.

The electron transport layer 124A is formed by vacuum deposition or the like of a metal oxide or fluoride on the light emitting layers 123, to have a film thickness from 1 nm to 10 nm, for example. On the electron transport layer 124A, the electron transport layer 124B is formed by co-evaporation of an organic material and a metal material, to have a film thickness from 10 nm to 50 nm, for example.

Note that the above film thicknesses of the electron transport layers 124A, 124B are examples, the film thicknesses are not limited to the above values, and are set to thicknesses that are most appropriate for optical light extraction.

(7) Common Electrode Forming Process (FIG. 13: Step S7)

After forming the electron transport layer 124, the common electrode 125 is formed so as to cover the electron transport layer 124. The common electrode 125 includes, in this order from the substrate 100x, the common electrode 125A made of a metal oxide and the common electrode 125B that is primarily metal layered on the common electrode 125A.

Figure 16C:
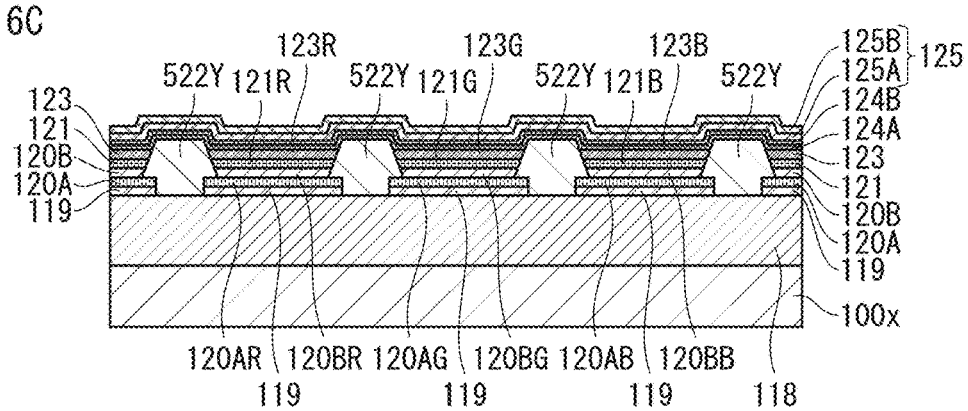

Of these, first, the common electrode 125A is formed by a method such as sputtering so as to cover the electron transport layer 124 (FIG. 16C). According to the present example, the common electrode 125A is formed by using a sputtering method to form a light-transmissive electrically-conductive layer of ITO, IZO, or the like.

Next, the common electrode 125B is formed on the common electrode 125A by using chemical vapor deposition (CVD), sputtering, or vacuum deposition (FIG. 16C). In the present example, the common electrode 125B is formed by depositing silver by using vacuum deposition.

(8) Sealing Layer Forming Process (FIG. 13: Step S8)

Figure 16D:
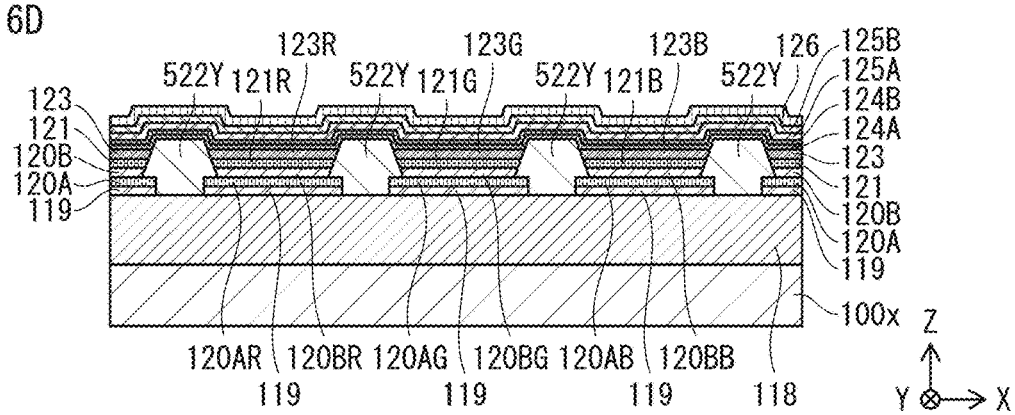

After forming the common electrode 125, the sealing layer 126 is formed so as to cover the common electrode 125 (FIG. 16D). The sealing layer 126 can be formed by using CVD, sputtering, or the like.

(9) Color Filter Substrate Joining Process (FIG. 13: Step S9)

Next, the color filter substrate 131 is formed and joined onto the sealing layer 126.

Figure 17A:
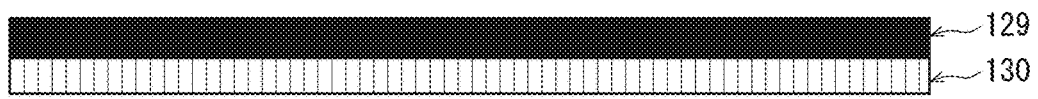
FIG. 17A, FIG. 17B, FIG. 17C, FIG. 17D, FIG. 17E, FIG. 17F, and FIG. 17G are schematic cross section diagrams illustrating processes in manufacturing a color filter substrate separately in manufacturing of the display panel according to at least one embodiment.

The upper substrate 130, which is light-transmissive, is prepared, and the material of the light shielding layers 129 that is primarily an ultraviolet curable resin (for example, ultraviolet curable acrylic resin) material, to which a black pigment is added, is applied on one surface of the upper substrate 130 (FIG. 17A).

Figure 17B:
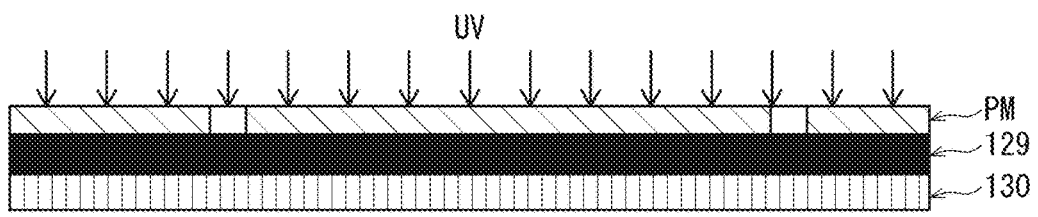

A pattern mask PM having defined openings is overlaid on an upper surface of the light shielding layer 129 and is irradiated from above with ultraviolet light (FIG. 17B).

Figure 17C:
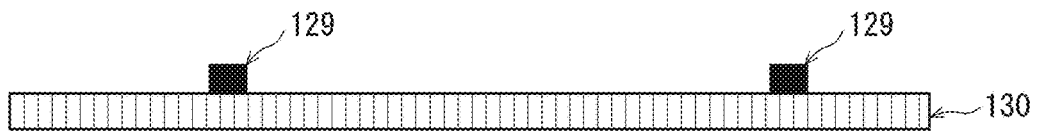

Then, by removing the pattern mask PM and uncured portions of the light shielding layer 129, developing, and curing, the light shielding layer 129 is completed and has, for example, substantially rectangular shapes in cross section (FIG. 17C).

Figure 17D:
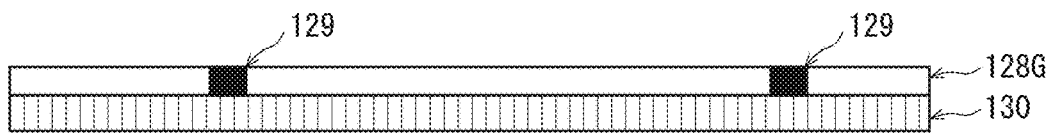
Figure 17E:
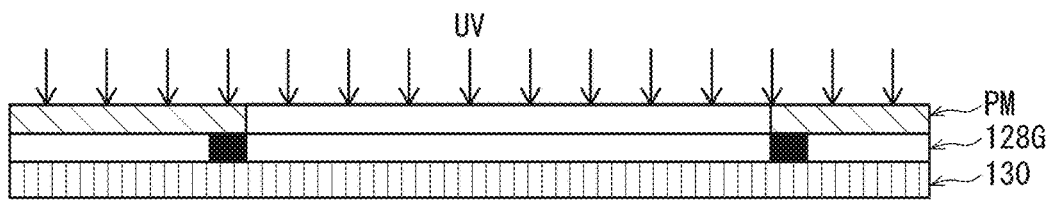

Next, a material 128G of a color filter layer 128G, for example, which is primarily an ultraviolet curable resin, is applied (FIG. 17D) to the surface of the upper substrate 130 on which the light shielding layer 129 is formed, then a defined pattern mask PM is overlaid and irradiation with ultraviolet light is performed (FIG. 17E).

Figure 17F:
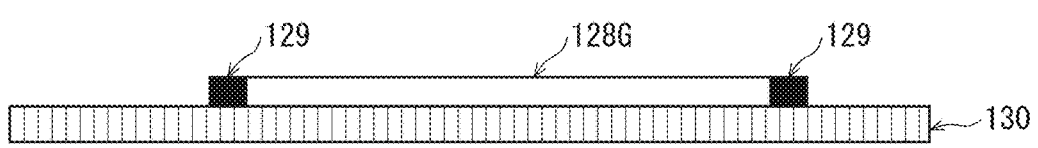
Figure 17G:
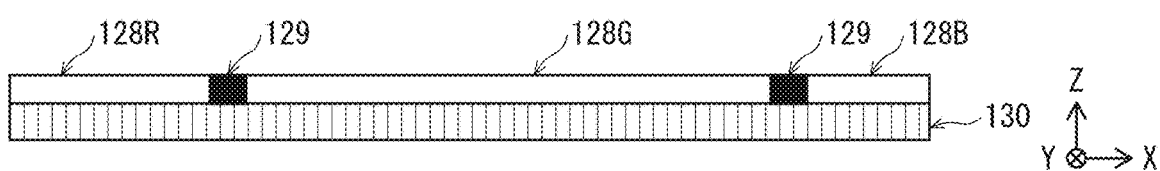

Subsequently, curing is performed, and the pattern mask PM and uncured portions of the material 128G are removed by developing to form the color filter layer 128G (FIG. 17F).

The color filter layers 128R and 128B are formed (FIG. 17G) by performing the processes in FIGS. 17D, 17E, and 17F with respect to color filter materials of each color.

A commercially available color filter product may be used instead of the color filter materials 128R, 128G, and 128B. Thus, the color filter substrate 131 is formed.

Figure 18A:
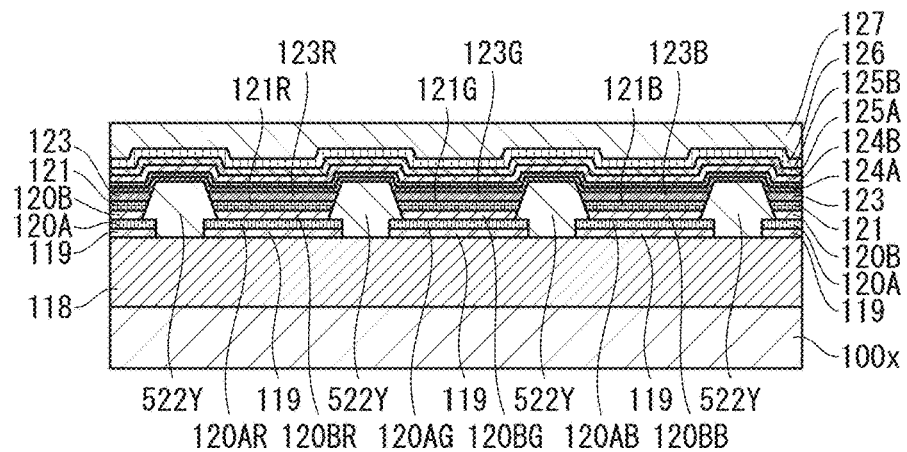
FIG. 18A and FIG. 18B are schematic cross section diagrams illustrating processes in manufacturing of the display panel according to at least one embodiment, continuing from FIG. 16D.

Next, a material of the joining layer 127 that is primarily an ultraviolet curable resin such as acrylic resin, silicone resin, epoxy resin, or the like, is applied to a back panel that includes every layer from the substrate 100x to the sealing layer 126 (FIG. 18A).

Figure 18B:
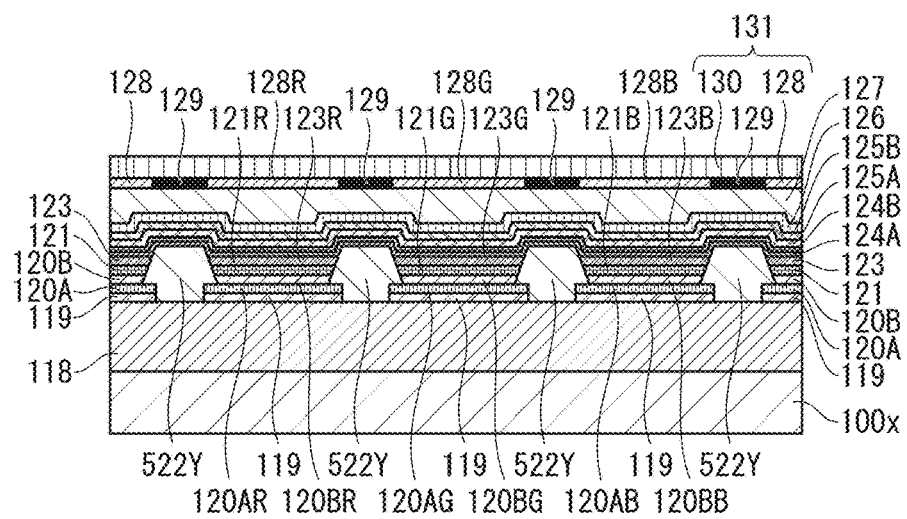

Next, the applied material is irradiated with ultraviolet light, and the back panel and the color filter substrate 131 are joined while matching positions relative to each other. No gas should enter between the back panel and the color filter substrate 131 at this time. Finally, a sealing process is completed by baking, thus completing the display panel 10 (FIG. 18B).

Note that the order described above in which steps are executed is for illustrative purposes, and the steps may be in an order other than described above. Further, a portion of the steps described above may be executed simultaneously (in parallel) with another step.

5. Synopsis

As described above, in the present embodiment, in manufacturing of an organic EL display panel including: a plurality of pixel electrodes 119 arranged in a matrix above the substrate 100x; column banks 522Y extending at least between the pixel electrodes 119 in the column direction and arranged side-by-side in the row direction above the substrate; organic functional layers including organic light emitting layers 123 respectively disposed continuously in the column direction in gaps 522z between the column banks 522Y that are adjacent in the row direction; and a common electrode 125 disposed above the organic functional layers, ink including an organic material of the same color is applied to a set of the gaps that are application targets by the application device while using different nozzle patterns. Accordingly, film thickness variation in the column direction of each gap 522z is not likely to appear at the same positions in the row direction, and occurrence of streaks of luminance unevenness in the row direction caused by film thickness variation of the light emitting layers is suppressed.

6. Other Embodiments

An organic EL display panel 10 pertaining to at least one embodiment has been described, but the present disclosure is not limited to the embodiment described above, except for essential characteristic elements thereof. For example, various modifications conceivable by a person having ordinary skill in the art, and any combination of elements and functions of embodiments and modifications that do not depart from the spirit of the present invention are also included in the present disclosure. The following describes modifications that are examples of other embodiments of the present disclosure.

(1) Nozzle patterns in the application device 200 are not limited to the ones illustrated in FIG. 8B. Any nozzle pattern may be used as long as, within a set of nozzle patterns used for applying ink of the same type to column openings (gaps 522z) that are in a sequence in the row direction, at least two nozzle patterns are different from each other. In such a configuration, streaks of luminance unevenness are less likely to occur compared to an example where a fixed nozzle pattern is repeatedly used for applying the ink of the same type to all the column openings that are in the sequence in the row direction.

In cases in which, for each of N (where N is an integer equal to or greater than two) gaps that are in a sequence in the row direction among the gaps to which an ink of the same type is to be supplied, a different pattern of a combination of the nozzles from which ink is to be ejected (nozzle pattern) is set in advance and the ink is supplied to each set of the gaps that are targets of application of the ink by repeatedly using the N patterns of the combinations, occurrence of streaks of luminance unevenness is suppressed to a greater extent than in cases in which the ink is applied to the gaps with use of a fixed nozzle pattern.

Further, occurrence of luminance unevenness is suppressed to a greater extent as the value of N increases. Specifically, the value of N preferably is 6 or more. In such cases, low image quality due to streaks of luminance unevenness is sufficiently suppressed (see FIG. 11).

Note that the patterns of the combinations of the nozzles from which ink is to be ejected are set such that, among the gaps to which the ink of the same type is to be supplied, nozzles that are used for ink ejection into a first gap are not used for ink ejection into a second gap where the first gap and the second gap are in a sequence in the row direction among the gaps to which the ink of the same type is to be supplied. This helps achieve suppression of occurrence of streaks of luminance unevenness.

Further, using different patterns of a combination of the nozzles from which ink is to be ejected (nozzle pattern) for first organic light emitting layers and second organic light emitting layers that emit a color that differs from the color emitted from the first organic light emitting layers helps suppress occurrence of streaks of luminance unevenness to a greater extent.

Here, when the pattern of a combination of the nozzles from which ink is to be ejected for forming the first organic light emitting layers and the pattern of a combination of the nozzles from which ink is to be ejected for forming the second organic light emitting layers are different from each other in the number of nozzles used to supply ink into one gap, the first organic light emitting layers will have different film thicknesses from the second organic light emitting layers. This helps reduce occurrence of streaks of luminance unevenness while implementing an optical resonator structure.

Further, the nozzle patterns may be set at random for each of the gaps by, for example, making use of a random number generator or the like.

(2) Description is provided above specifically of the application device 200 for light emitting layers as an application device included in a functional layer forming device according to at least one embodiment. However, as described above, other functional layers that are formed with use of an organic material by using an application method may be formed with use of a similar application device.

This is because film thickness variation of functional layers particularly affects luminance unevenness when an optical resonator structure is implemented.

(3) In the display panel 10 according to at least one embodiment, the light emitting layers 123 extend continuously in the column direction on the row banks. However, a configuration in which the light emitting layers 123 are separated by some of the row banks is possible. In such a configuration, the applied ink is levelled within each range of sub-pixels partitioned by the row banks and occurrence of streaks of luminance unevenness is suppressed through changing the nozzle patterns used for ink application within each range of sub-pixels.

(4) According to the display panel 10 according to at least one embodiment, there are red pixels, green pixels, and blue pixels among the sub-pixels 100se, but the present invention is not limited to this example. As another example, the light emitting layers may all be of a single type, or there may be four types emitting colors of light such as red, green, blue, and white.

The present disclosure is characterized in changing the nozzle patterns between the gaps that are in a sequence in the row direction among the gaps to which an ink of the same type is to be applied. Accordingly, when the light emitting layers emit light of a single color and when forming the functional layers, an ink of the same type is applied for all the gaps. In such cases, nozzle patterns for ink application are changed between each adjacent pair of the gaps 522z.

(5) Further, according to at least one embodiment, the unit pixels 100e are arranged in a matrix, but the present invention is not limited in this way. For example, the invention is effective even when spacing between pixel regions is at one pitch, and adjacent pixel regions similarly spaced are shifted by a half pitch in the column direction. For high resolution display panels, some shift in the column direction is hard to visually determine, and even if some film thickness variation is lined up on a straight line (or staggered line) of a certain thickness, it will appear as a band. Accordingly, even with such a configuration, display quality of a display panel can be increased by suppressing lining up of luminance unevenness along a staggered line.

(6) Further, according to at least one embodiment, the hole injection layers 120, the hole transport layers 121, the light emitting layers 123, and the electron transport layer 124 are present between the pixel electrodes 119 and the common electrode 125, but the present invention is not limited to this configuration. For example, a configuration is possible in which only the light emitting layers 123 are present between the pixel electrodes 119 and the common electrode 125, without using the hole injection layers 120, the hole transport layers 121, and the electron transport layer 124. Further, for example, a configuration is possible in which a layer or a plurality of layers selected from the group consisting of hole injection layers, hole transport layers, an electron transport layer, and an electron injection layer are present. Further, all these layers need not be made of organic compounds, and at least one layer other than the organic light emitting layers may be made of an inorganic compound.

(7) According to at least one embodiment, the application device 200 is used for forming the light emitting layers 123. However, the application device according to the present disclosure is applicable to cases in which one or more thin films of an inorganic material and one or more thin films of a resin material are layered alternatingly as a sealing film for a flexible organic EL display panel or the like and the thin films of the resin material are formed with use of an inkjet application device.

In such cases, the nozzle patterns are not changed between each of the adjacent column openings, but are changed, for example, cyclically or acyclically upon completion of one or more sequences of ink application with use of a nozzle pattern of the nozzles arrayed in the main scanning direction (Y direction: direction in which the nozzles are arrayed).

(8) Further, according to at least one embodiment, a configuration is used in which two transistors $Tr_1$, $Tr_2$ are provided for each of the sub-pixels 100se, but the present invention is not limited to this. For example, a configuration may be used in which a single transistor or three or more transistors correspond to one sub-pixel.

(9) Further, according to at least one embodiment, a top-emission type of EL display panel is given as an example, but the present invention is not limited to this. For example, a bottom-emission type of the display panel or the like can be used. In such a case, each configuration can be changed appropriately.

(10) Description is provided above of a method of manufacturing an organic EL display panel in which organic EL light emitting layers are used. However, in addition to such organic EL display panels, display panels such as inorganic EL display panels in which inorganic EL light emitting layers are used and quantum dot display panels in which quantum dot light emitting diode (QLED) light emitting layers are used (see, for example, JP2010-199067) have a structure similar to organic EL display panels in that light emitting layers and other functional layers are disposed between pixel electrodes and a counter electrode, although structures and types of the light emitting layers are different. Accordingly, the present disclosure is applicable to forming of such display panels when application processing is used for forming the light emitting layers and other functional layers.

<<Supplement>>

The embodiments described above each indicate one beneficial specific example of the present invention. Numerical values, shapes, materials, constituent elements, arrangement positions and connections of constituent elements, steps, order of steps, and the like indicated in manufacturing methods are merely examples and are not intended to limit the present invention.

Further, among constituent elements in the embodiments, any elements not described in independent claims representing top level concepts of the present invention are described as constituent elements constituting a more beneficial embodiment.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

The invention claimed is:

1. A method of manufacturing an organic electroluminescence (EL) display panel in which a plurality of pixels are arranged in a matrix of rows and columns, the method comprising:
forming pixel electrodes arranged in the matrix above a substrate;
forming column banks above the substrate in spaces between the pixel electrodes in a row direction to be parallel with each other and to extend in a column direction;
forming functional layers including organic light emitting layers in gaps between the column banks that are adjacent in the row direction, the forming of the functional layers including application processing of causing relative motion in the row direction between the substrate and a head provided with a plurality of nozzles arranged along the column direction while performing ink ejection from selected nozzles among the plurality of nozzles to supply the gaps with one or more inks each including an organic material; and
forming a counter electrode above the functional layers, wherein
in the forming of the functional layers, among a set of the gaps to which one of the one or more inks is to be supplied, nozzle patterns each representing a combination of the selected nozzles for a gap differ between a first gap and a second gap in a sequence in the row direction of the set, and a first pixel of the plurality of pixels defined in the first gap is configured to have a same emission color as a second pixel of the plurality of pixels defined in the second gap.

2. The method of claim 1, wherein
in the forming of the functional layers, the organic material is an organic light emitting material and the functional layers include only the organic light emitting layers.

3. The method of claim 1, wherein
for each of N gaps in a sequence in the row direction of the set, a different one of the nozzle patterns is used, N being an integer equal to or greater than two, and
the application processing is performed with respect to the gaps of the set by repeatedly using the nozzle patterns for the N gaps in the row direction.

4. The method of claim 3, wherein
N is an integer equal to or greater than six.

5. The method of claim 1, wherein
the nozzle patterns for the set of the gaps are set such that all of the selected nozzles used for ink ejection into the first gap are not used at least for ink ejection into the second gap.

6. The method of claim 1, wherein
in the forming of the functional layers, the application processing is performed with the head fixed in the row direction and with the substrate being moved in the row direction relative to the head.

7. The method of claim 1, wherein
the forming of the functional layers includes:
forming of first organic light emitting layers; and
forming of second organic light emitting layers emitting a different color from color emitted from the first organic light emitting layers, and
nozzle patterns used in the forming of the first organic light emitting layers are different from nozzle patterns used in the forming of the second organic light emitting layers.

8. The method of claim 7, wherein
the nozzle patterns used in the forming of the first organic light emitting layers differ from the nozzle patterns used in the forming of the second organic light emitting layers in a number of the nozzles used for supplying ink into one gap.

9. A method of manufacturing a display panel in which a plurality of pixels are arranged in a matrix of rows and columns, the method comprising:
forming pixel electrodes arranged in the matrix above a substrate;
forming column banks above the substrate in spaces between the pixel electrodes in a row direction to be parallel with each other and to extend in a column direction;
forming functional layers including organic light emitting layers in gaps between the column banks that are adjacent in the row direction, the forming of the functional layers including application processing of causing relative motion in the row direction between the substrate and a head provided with a plurality of nozzles arranged along the column direction while performing ink ejection from selected nozzles among the plurality of nozzles to supply the gaps with one or more inks each including a functional material; and
forming a counter electrode above the functional layers, wherein
in the forming of the functional layers, among a set of the gaps to which one of the one or more inks is to be supplied, nozzle patterns each representing a combination of the selected nozzles for a gap differ between a first gap and a second gap in a sequence in the row direction of the set, wherein
for each of N gaps in a sequence in the row direction of the set, a different one of the nozzle patterns is used, N being an integer equal to or greater than six, and
the application processing is performed with respect to the gaps of the set by repeatedly using the nozzle patterns for the N gaps in the row direction.

10. The method of claim 9, wherein
in the forming of the functional layers, the organic material is an organic light emitting material and the functional layers include only the organic light emitting layers.

11. The method of claim 9, wherein
the nozzle patterns for the set of the gaps are set such that all of the selected nozzles used for ink ejection into the first gap are not used at least for ink ejection into the second gap.

12. The method of claim 9, wherein
in the forming of the functional layers, the application processing is performed with the head fixed in the row direction and with the substrate being moved in the row direction relative to the head.

13. The method of claim 9, wherein
the forming of the functional layers includes:
forming of first organic light emitting layers; and
forming of second organic light emitting layers emitting a different color from color emitted from the first organic light emitting layers, and
nozzle patterns used in the forming of the first organic light emitting layers are different from nozzle patterns used in the forming of the second organic light emitting layers.

14. The method of claim 13, wherein
the nozzle patterns used in the forming of the first organic light emitting layers differ from the nozzle patterns used in the forming of the second organic light emitting layers in a number of the nozzles used for supplying ink into one gap.

15. A device for manufacturing functional layers in an organic EL display panel in which a plurality of pixels are arranged in a matrix of rows and columns, the device comprising:
an application device configured to apply one or more inks each including a functional material to gaps between column banks that are parallel with each other, extend in a column direction, and are above the substrate in spaces between the pixel electrodes in a row direction, the application device comprising:
a head that includes a plurality of nozzles arranged along the column direction wherein a width of the head in the row direction is greater than a width of the organic EL display panel;
a moving unit configured to cause relative motion in the row direction between the head and the substrate; and
a supply controller configured to cause the one or more inks to be supplied from selected nozzles among the plurality of nozzles such that, in the forming of the functional layers, among a set of the gaps to which one of the one or more inks is to be supplied, nozzle patterns each representing a combination of the selected nozzles for a gap differ between a first gap and a second gap in a sequence in the row direction of the set.

16. The device of claim 15, wherein the supply controller is configured to:
cause, for each of N gaps in a sequence in the row direction of the set, a different one of the nozzle patterns is used, N being an integer equal to or greater than two, and
perform application with respect to the gaps of the set by repeatedly using the nozzle patterns for the N gaps in the row direction.

17. The device of claim 16, wherein
N is an integer equal to or greater than six.

18. The device of claim 15, wherein the supply controller is configured to set the nozzle patterns for the gaps such that all of the selected nozzles used for ink ejection into the first gap are not used at least for ink ejection into the second gap.

19. The device of claim 15, wherein the moving unit is configured to move the substrate being in the row direction relative to the head.

20. The device of claim 15, wherein the supply controller is configured to:
cause ink ejection for forming first organic light emitting layers using a first nozzle pattern including a first number of nozzles; and
cause ink ejection for of second organic light emitting layers for emitting a different color from color emitted from the first organic light emitting layers using a second nozzle pattern including a second number of nozzles, and the second number of nozzles is different from the first number of nozzles.

* * * * *